(12) United States Patent
Kim

(10) Patent No.: US 12,444,683 B2
(45) Date of Patent: Oct. 14, 2025

(54) SEMICONDUCTOR DEVICE

(71) Applicant: Samsung Electronics Co., Ltd., Suwon-si (KR)

(72) Inventor: Jee Woong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 409 days.

(21) Appl. No.: 18/120,367

(22) Filed: Mar. 11, 2023

(65) Prior Publication Data

US 2024/0021519 A1 Jan. 18, 2024

(30) Foreign Application Priority Data

Jul. 15, 2022 (KR) .................. 10-2022-0087390

(51) Int. Cl.
*H01L 23/528* (2006.01)
*H01L 23/48* (2006.01)
*H01L 23/522* (2006.01)
*H10B 10/00* (2023.01)

(52) U.S. Cl.
CPC ........ *H01L 23/5283* (2013.01); *H01L 23/481* (2013.01); *H01L 23/5226* (2013.01); *H10B 10/125* (2023.02)

(58) Field of Classification Search
CPC .............. H01L 23/5283; H01L 23/481; H01L 23/5226; H10B 10/125
USPC ....................................................... 257/288
See application file for complete search history.

(56) References Cited

U.S. PATENT DOCUMENTS

| | | |
|---|---|---|
| 11,133,254 B2 | 9/2021 | Lai et al. |
| 11,581,038 B2 * | 2/2023 | Baeck ................. H10B 10/18 |
| 2021/0305262 A1 | 9/2021 | Wang et al. |
| 2021/0343332 A1 | 11/2021 | Chiu et al. |
| 2021/0357565 A1 | 11/2021 | Fang et al. |
| 2021/0375883 A1 | 12/2021 | Hsu et al. |
| 2022/0037337 A1 | 2/2022 | Wang et al. |
| 2022/0059460 A1 | 2/2022 | Do et al. |

OTHER PUBLICATIONS

R. Mathur et al., "Buried Interconnects for Sub-5 nm SRAM Design," IEEE Transactions on Electron Devices, Mar. 2022, vol. 69, No. 3.

S.M. Salahuddin et al. , "SRAM with buried power distribution to improve write margin and performance in advanced technology nodes," IEEE Electron device letters, Aug. 2019, vol. 40, No. 8.

* cited by examiner

*Primary Examiner* — Tu-Tu V Ho
(74) *Attorney, Agent, or Firm* — Muir Patent Law, PLLC

(57) ABSTRACT

A semiconductor device includes a substrate having first and second surfaces, first to third conductive line structures disposed on the first surface, extending in a first direction, and spaced apart from each other in a second direction, and a SRAM unit cell disposed on the first surface, and including first and second inverters connected to each other, a first pass transistor connected to the first inverter, a second pass transistor connected to the second inverter, a first gate electrode included in the first inverter, and a second gate electrode included in the first pass transistor, the first inverter and the first pass transistor are disposed between the first and third conductive line structures, the second inverter and the second pass transistor are disposed between the second and third conductive line structures, and the first and second gate electrodes are disposed between the first and third conductive line structures.

20 Claims, 17 Drawing Sheets

SEMICONDUCTOR DEVICE

CROSS-REFERENCE TO RELATED APPLICATION(S)

This application claims priority under 35 U.S.C. § 119 to Korean Patent Application No. 10-2022-0087390 filed on Jul. 15, 2022 in the Korean Intellectual Property Office, the disclosure of which is incorporated by reference herein in its entirety.

BACKGROUND

1. Technical Field

The present disclosure relates to a semiconductor device.

2. Description of Related Art

An integrated circuit may include various circuits having respective functions, such as a memory circuit having a plurality of memory bit cells for holding information. The memory circuit may include a non-volatile memory device or a volatile memory device. For example, the volatile memory device may include a SRAM (static-random-access memory) device.

A multi-channel transistor having a fin-like active area, a nanowire active area, or a nanosheet active area is used to improve device performance. Since the multi-channel transistor needs a narrow active pattern width for short channel control, a source/drain area smaller than a source/drain area of a planar transistor may be useful. This may reduce an alignment margin, and further reduce a device pitch, and increase a packing density.

Further, as a metal wiring continues to shrink to a smaller feature size to improve a circuit routing density, an existing metal wiring structure scheme faces various challenges at a tighter pitch metal layer. For example, there is a metal filling problem due to a metal line or plug, and a diffusion barrier metal layer is needed for reliability. The barrier layer further reduces sizes of the metal line and the metal plug.

This barrier metal layer affects trench fill capability, thereby lowering metal resistance or even causing via opening or electromigration (EM) problem, for example. Other issues associated with the reduction in the device size include increased routing resistance, increased parasitic capacitance, short circuit, leakage, alignment margin, layout flexibility, and packing density.

Therefore, in order to achieve improved circuit performance and reliability, and increased packing density to improve the above disclosed issues, research on a SRAM unit cell is needed.

SUMMARY

A purpose of the present disclosure is to provide a semiconductor device capable of improving operational characteristics and reliability of an SRAM, using a conductive line structure that may be used as a connection wiring while cutting a gate electrode.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

According to an aspect of the present disclosure, there is provided a semiconductor device comprising a substrate having a first surface and a second surface opposite to the first surface, a first conductive line structure and a second conductive line structure disposed on the first surface of the substrate, extending in a first direction, and spaced apart from each other in a second direction, a third conductive line structure disposed on the first surface of the substrate and between the first conductive line structure and the second conductive line structure, and extending in the first direction, and a SRAM unit cell disposed on the first surface of the substrate, wherein the SRAM unit cell includes a first inverter and a second inverter connected to each other in a cross-coupled manner, a first pass transistor connected to the first inverter, a second pass transistor connected to the second inverter, a first gate electrode included in the first inverter, and a second gate electrode included in the first pass transistor, wherein the first inverter and the first pass transistor are disposed between the first conductive line structure and the third conductive line structure, wherein the second inverter and the second pass transistor are disposed between the second conductive line structure and the third conductive line structure, and wherein the first gate electrode and the second gate electrode are disposed between the first conductive line structure and the third conductive line structure.

According to another aspect of the present disclosure, there is provided a semiconductor device comprising a substrate having a first surface and a second surface opposite to the first surface, an SRAM unit cell disposed on the first surface of the substrate, a first conductive line structure disposed on the first surface of the substrate and extending in a first direction, and a first power line disposed on the second surface of the substrate and connected to the first conductive line structure, wherein the SRAM unit cell includes a first inverter and a second inverter connected to each other in a cross-coupled manner, a first pass transistor connected to the first inverter, and a second pass transistor connected to the second inverter, wherein the first inverter includes a first pulldown transistor, and a first pullup transistor including a first gate electrode and connected to the first power line, wherein the second inverter includes a second pulldown transistor, and a second pullup transistor including a second gate electrode and connected to the first power line, and wherein each of a short side of the first gate electrode extending in the first direction and a short side of the second gate electrode extending in the first direction faces a sidewall of the first conductive line structure.

According to still another aspect of the present disclosure, there is provided a semiconductor device comprising a substrate having a first surface and a second surface opposite to the first surface, an SRAM unit cell disposed on the first surface of the substrate, a conductive line structure disposed on the first surface of the substrate, and including an isolated conductive line extending in a first direction, and an isolation line insulating film on a sidewall of the isolated conductive line, a bridge wiring line disposed on the first surface of the substrate, extending in a second direction, and intersecting the isolated conductive line on an upper surface of the isolated conductive line, and a power line disposed on the second surface of the substrate and connected to the isolated conductive line, wherein the SRAM unit cell includes a first inverter and a second inverter connected to each other in a cross-coupled manner, a first pass transistor connected to the first inverter, a second pass transistor connected to the second inverter, a first gate electrode included in the first inverter, a second gate electrode included in the first pass transistor, a third gate electrode included in the second inverter, and a fourth gate electrode included in the second pass transistor, wherein the first gate electrode and the second gate electrode are separated from the third gate electrode and the fourth gate electrode by the conductive line structure, wherein a pullup transistor of the first inverter and a pullup transistor of the second inverter are connected to the power line, and wherein the bridge wiring line connects a source/drain area of the pullup transistor of the first inverter to the third gate electrode.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTION

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In drawings of a semiconductor device according to some embodiments, a fin-like transistor (FinFET) including a channel area having a fin-like pattern shape, and a transistor including a nano wire or a nano sheet are illustrated by way of example. However, the present disclosure is not limited thereto. The technical idea of the present disclosure may be applied to a planar transistor.

Further, the semiconductor device according to some embodiments may include a tunneling transistor (tunneling FET) or a three-dimensional (3D) transistor. The semiconductor device according to some embodiments may include a bipolar junction transistor, a lateral double diffusion transistor (LDMOS), and the like.

Following description provides various embodiments of a static random access memory (SRAM) device, various embodiments of the SRAM device having power lines (e.g., high power line Vdd, low power line Vss), a bit-line, and a word-line distributed on front and rear surfaces of a substrate so that overall device performance is improved between various trade-off parameters such as metal routing resistance and parasitic capacitance.

Figure 1:
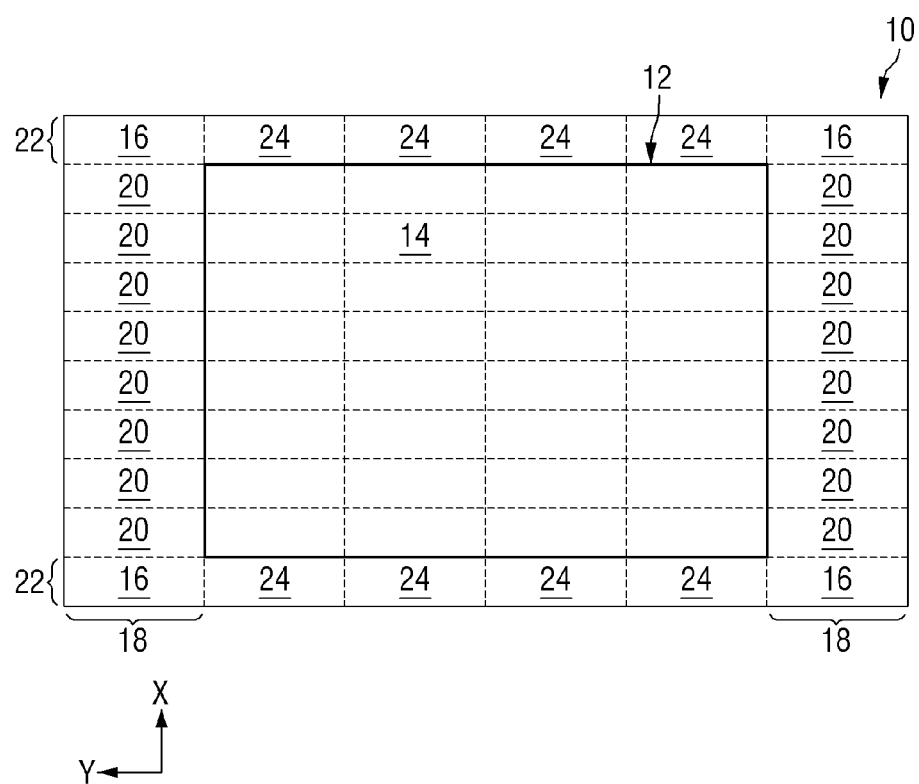
FIG. 1 is a plan view of a semiconductor device including a static random access memory (SRAM) device according to some embodiments.
Figure 2:
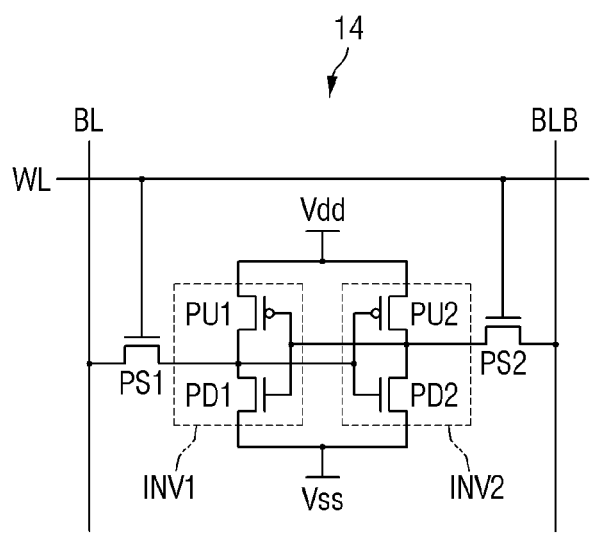
FIG. 2 is a circuit diagram for illustrating a SRAM unit cell of the semiconductor device of FIG. 1.
Figure 3:
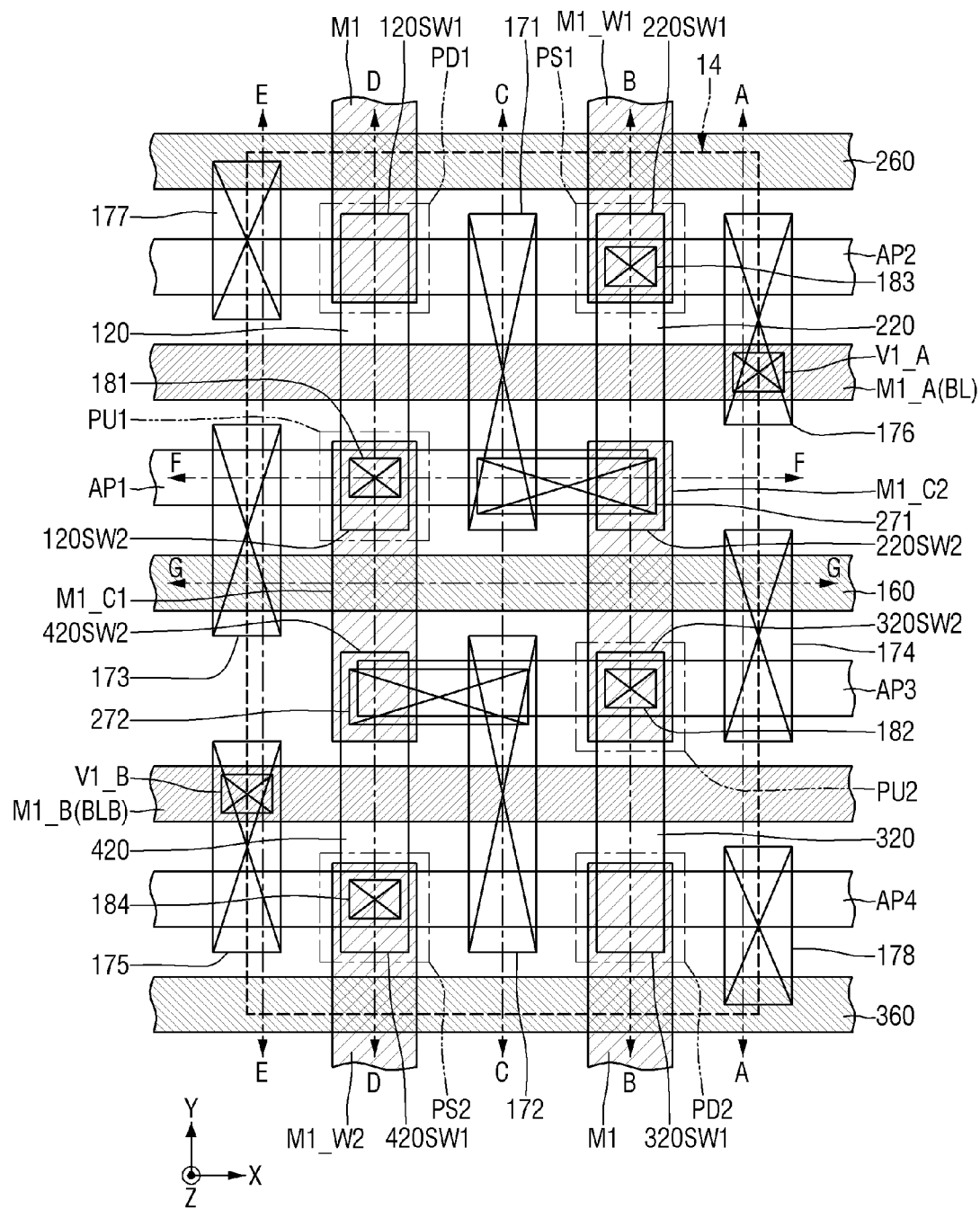
FIG. 3 is a layout diagram of the SRAM unit cell of the semiconductor device in FIG. 1 according to some embodiments.
Figure 4:
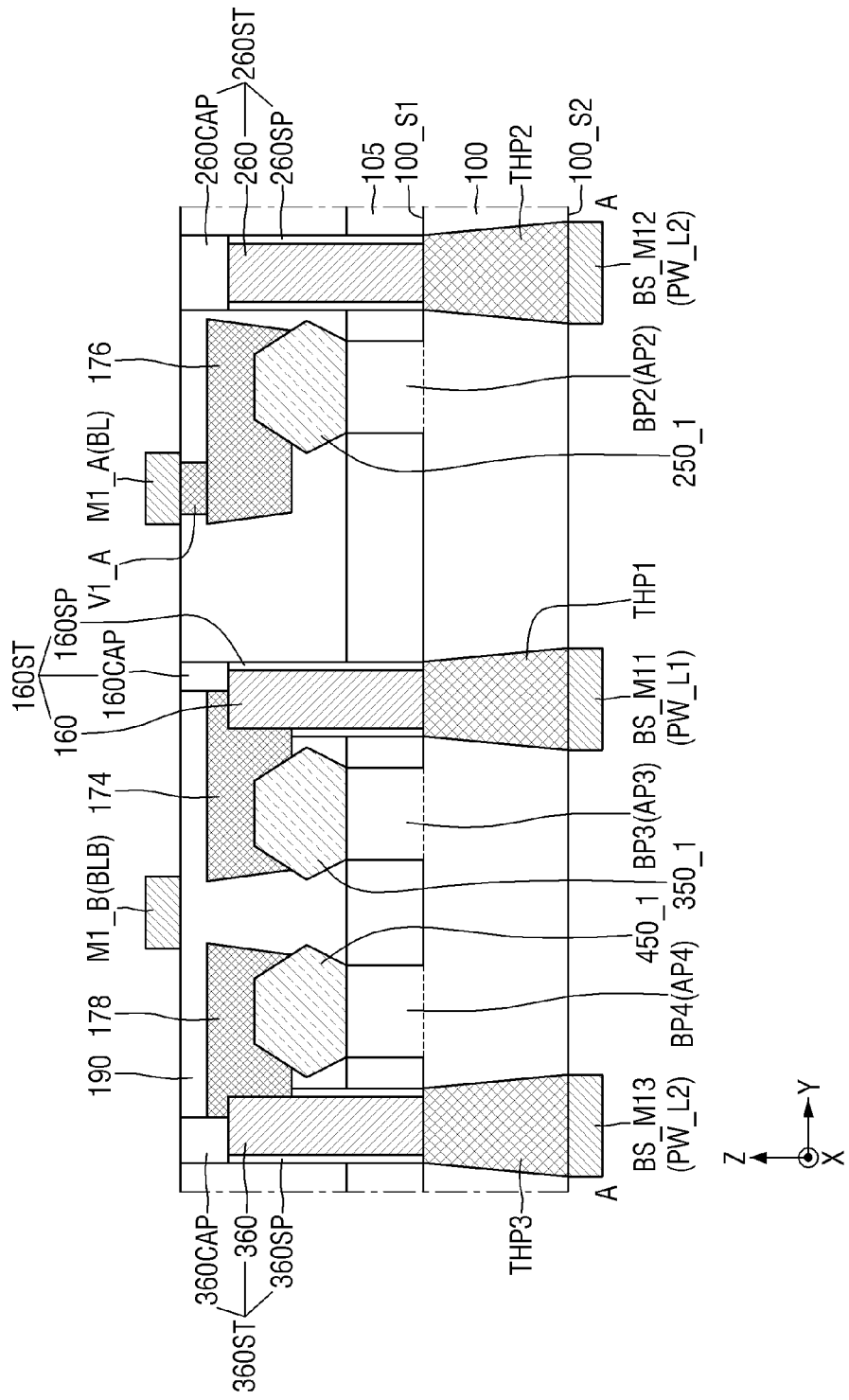
FIG. 4 is a cross-sectional view taken along A-A of FIG. 3 according to some embodiments.
Figure 5:
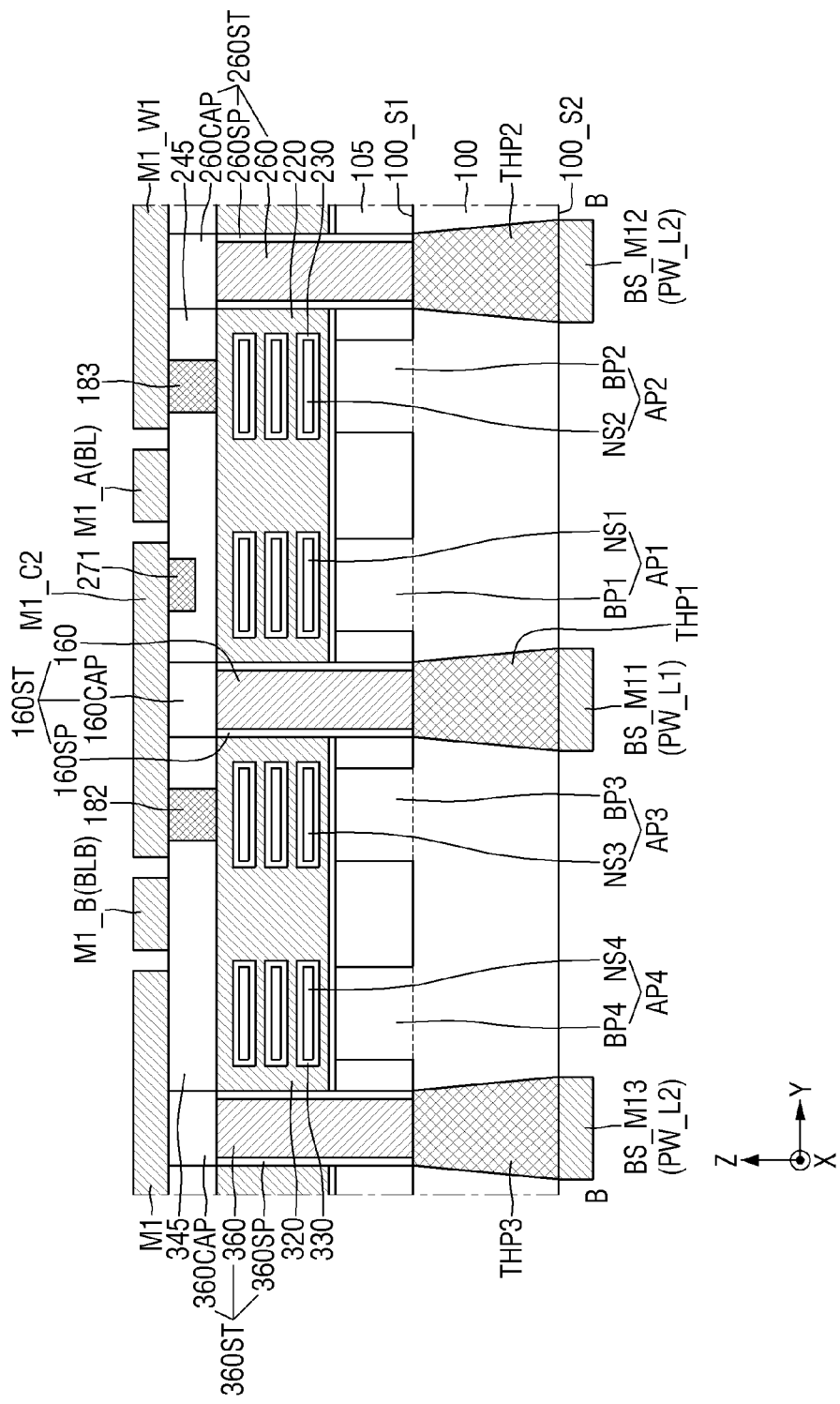
FIG. 5 is a cross-sectional view taken along B-B of FIG. 3 according to some embodiments.
Figure 6:
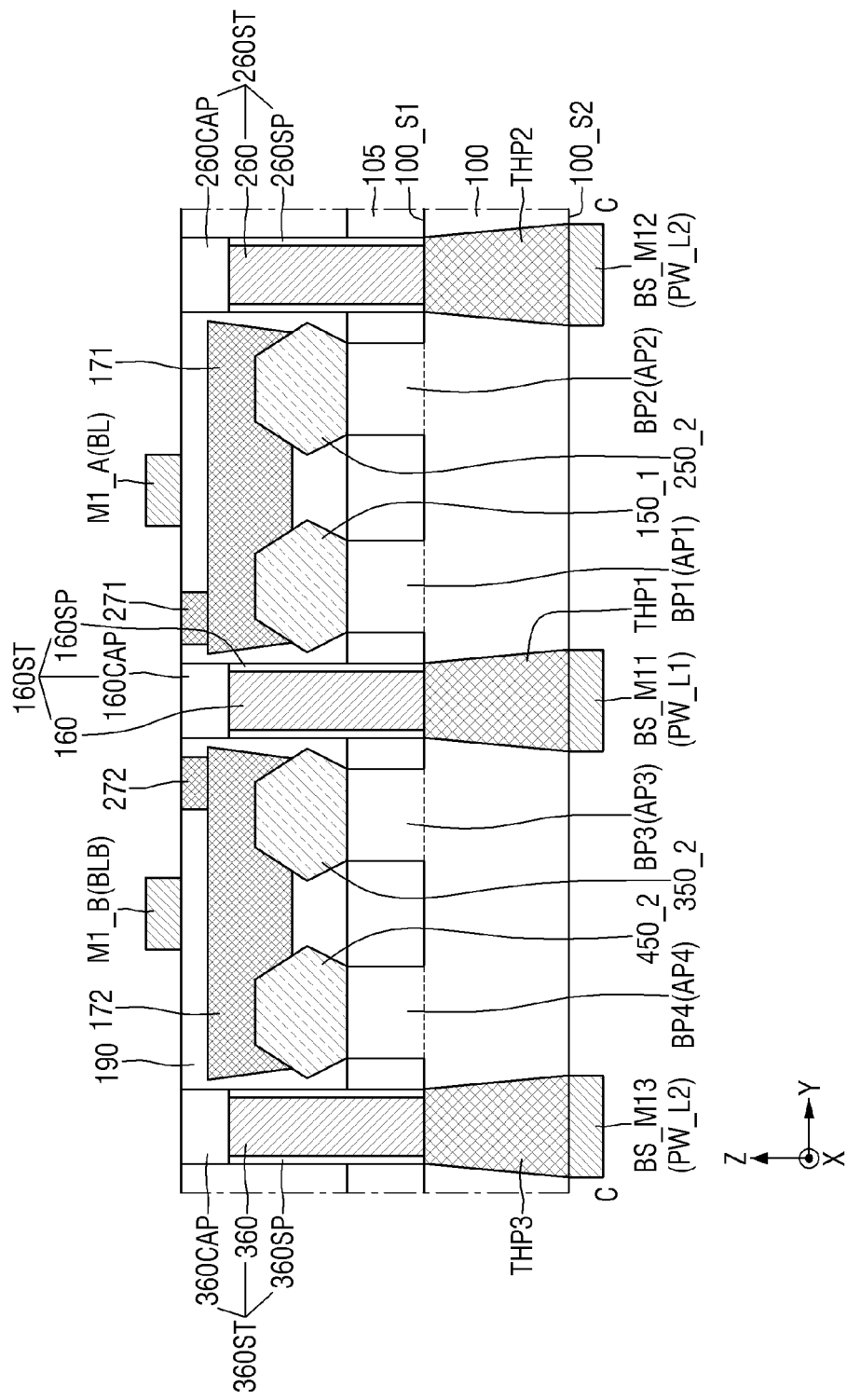
FIG. 6 is a cross-sectional view taken along C-C of FIG. 3 according to some embodiments.
Figure 7:
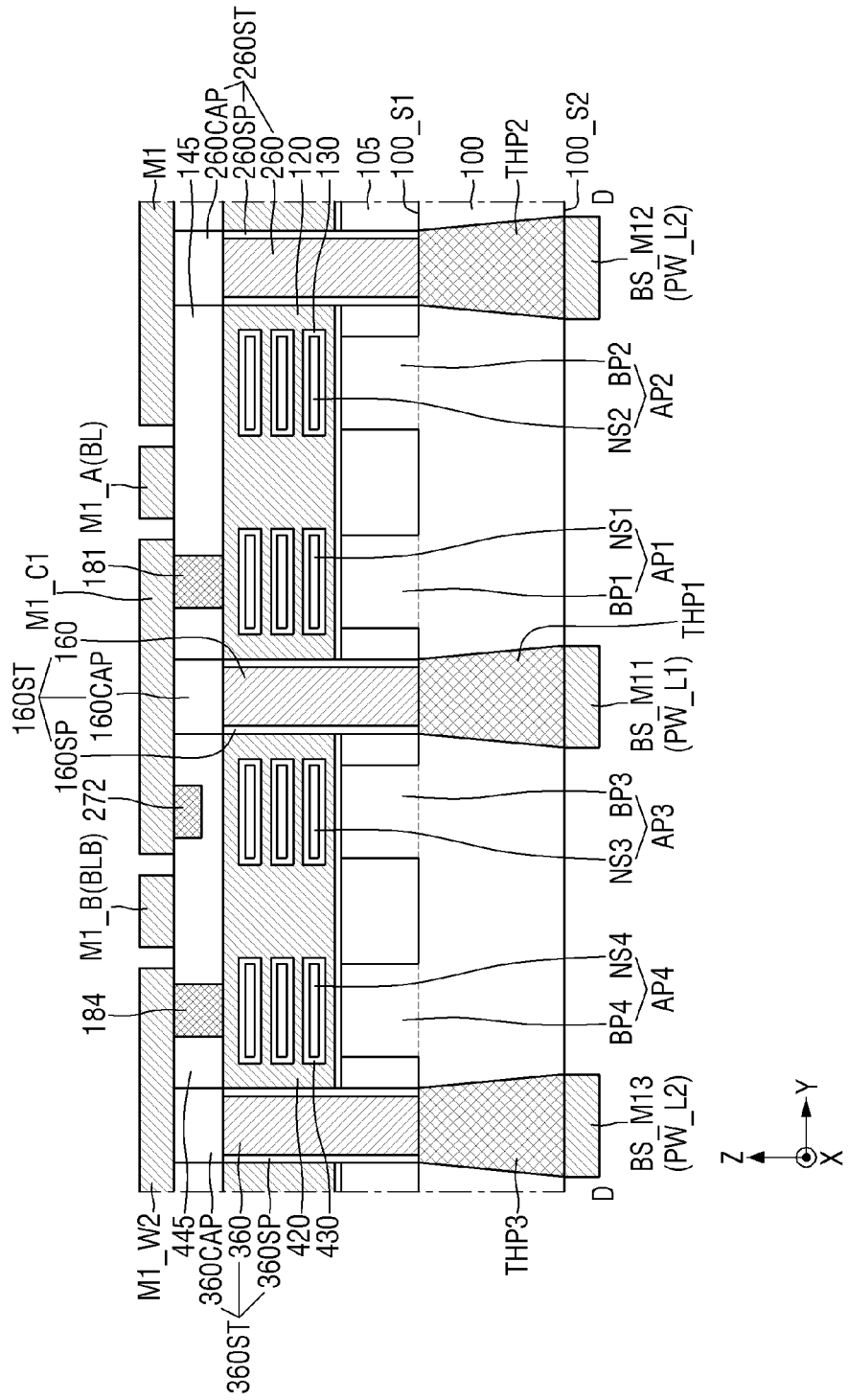
FIG. 7 is a cross-sectional view taken along D-D of FIG. 3 according to some embodiments.
Figure 8:
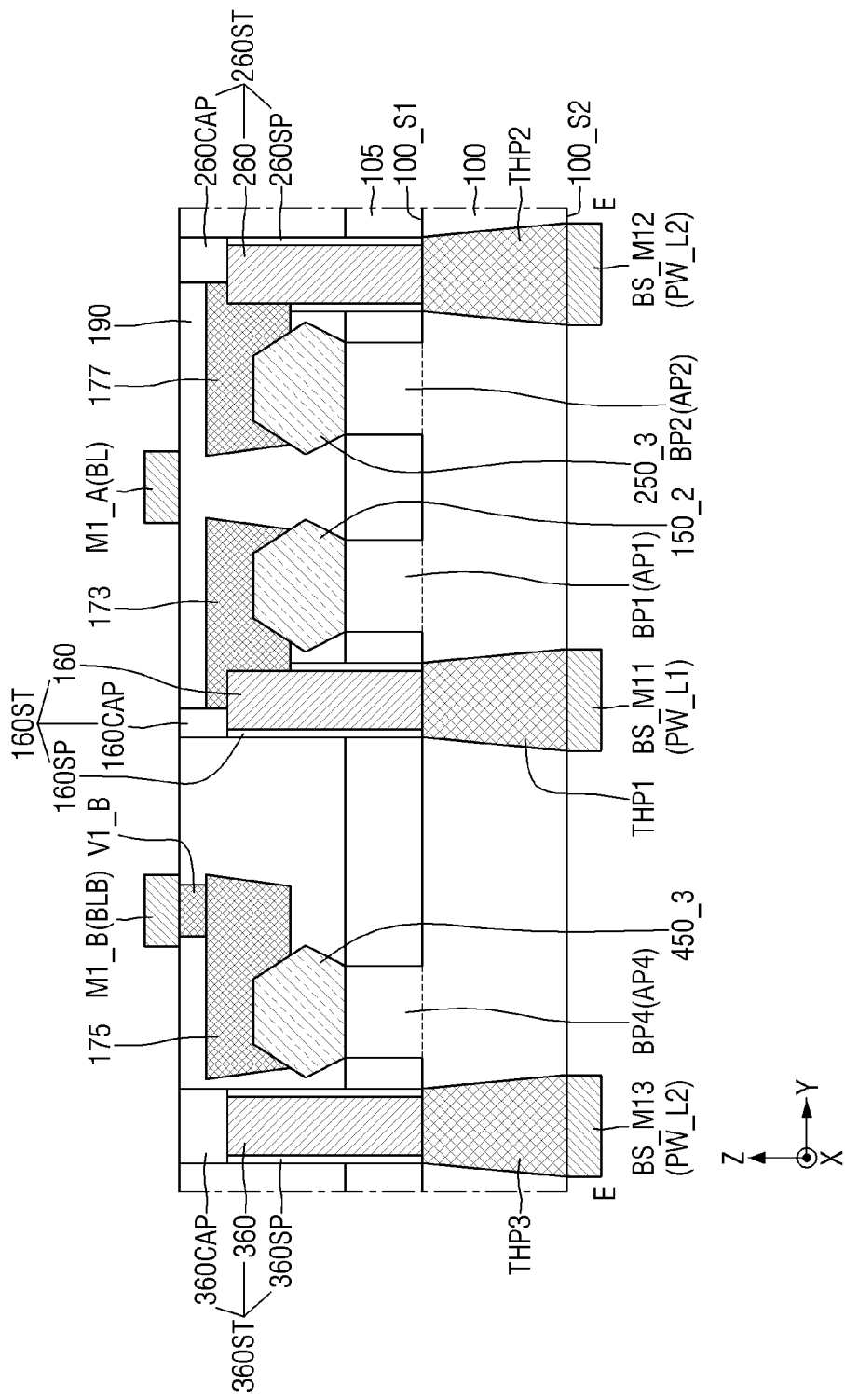
FIG. 8 is a cross-sectional view taken along E-E of FIG. 3 according to some embodiments.
Figure 9:
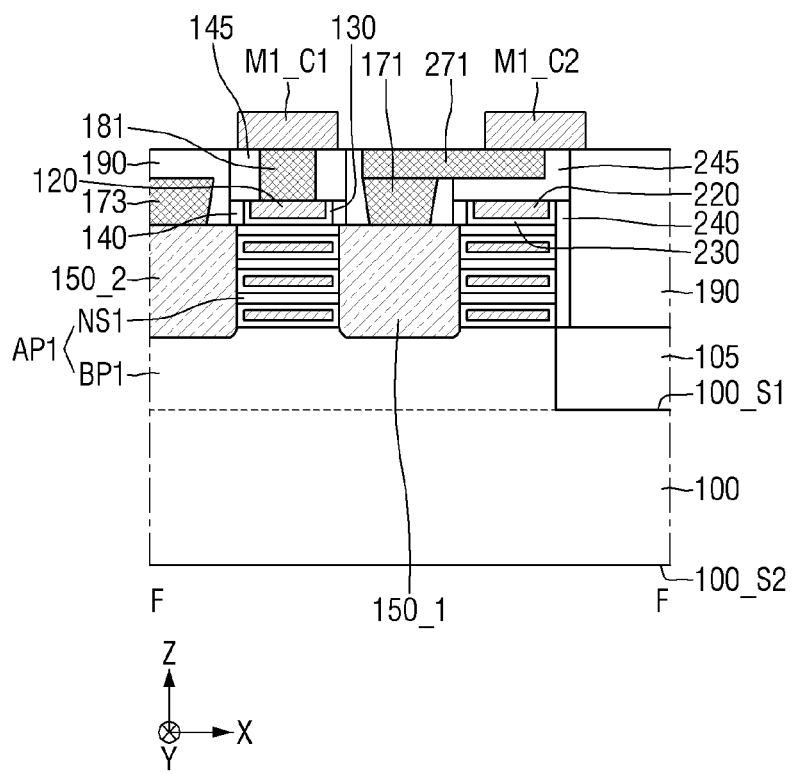
FIG. 9 is a cross-sectional view taken along F-F of FIG. 3 according to some embodiments.
Figure 10:
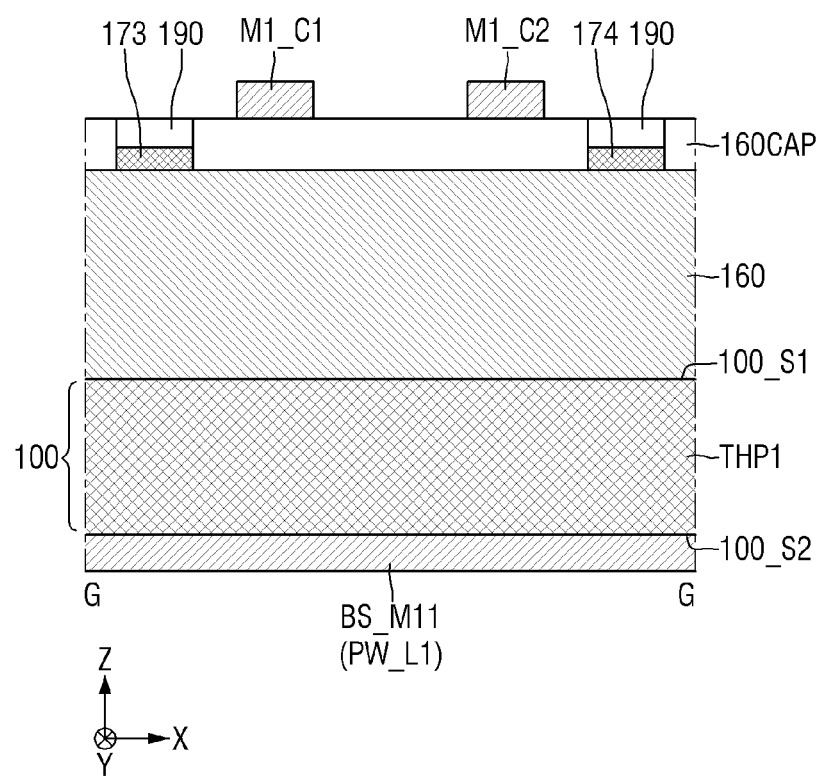
FIG. 10 is a cross-sectional view taken along G-G of FIG. 3 according to some embodiments.

FIG. 1 is a plan view of a semiconductor device including a SRAM device according to some embodiments. FIG. 2 is a circuit diagram for illustrating a SRAM unit cell of the semiconductor device of FIG. 1. FIG. 3 is a layout diagram of the SRAM unit cell of the semiconductor device in FIG. 1 according to some embodiments. FIG. 4 is a cross-sectional view taken along A-A of FIG. 3 according to some embodiments. FIG. 5 is a cross-sectional view taken along B-B of FIG. 3 according to some embodiments. FIG. 6 is a cross-sectional view taken along C-C of FIG. 3 according to some embodiments. FIG. 7 is a cross-sectional view taken along D-D of FIG. 3 according to some embodiments. FIG. 8 is a cross-sectional view taken along E-E of FIG. 3 according to some embodiments. FIG. 9 is a cross-sectional view taken along F-F of FIG. 3 according to some embodiments. FIG. 10 is a cross-sectional view taken along G-G of FIG. 3 according to some embodiments.

Referring to FIG. 1, a semiconductor device 10 according to some embodiments includes an SRAM circuit having an SRAM array 12 of a plurality of SRAM unit cells (or SRAM bit cells) 14 arranged in an array. In the array 12, the unit cells 14 may be arranged in a plurality of rows and a plurality of columns. In this case, the semiconductor device 10 may be a SRAM device.

The semiconductor device 10 may further include other devices/circuit modules (for example, a logic device, a high-frequency device, an image sensing device, a dynamic random access memory (DRAM) device, or combinations thereof) integrated with the SRAM device.

In some embodiments, each column of the SRAM unit cells 14 in the SRAM array 12 may extend along a first direction X, while each row of the SRAM unit cells 14 in the SRAM array 12 may extend along a second direction Y. The first direction X and the second direction Y may represent directions in parallel with an upper surface (e.g., 100_S1 of FIG. 4) of the substrate, and the first direction X and the second direction Y may include directions perpendicular to each other. For example, each column may include N1 SRAM unit cells 14 arranged in a line (column) along the first direction X, while each row may include N2 SRAM unit cells 14 arranged in a line (row) along the second direction Y. That is, the SRAM array 12 may include SRAM unit cells 14 arranged in a matrix of N1 rows and N2 columns. In the SRAM array 12 of some embodiments, each column may include 8, 16, 32, 64 or 128 SRAM unit cells 14, and each row may include 4, 8, 16 or 32 SRAM unit cells 14. In an embodiment illustrated in FIG. 1, the SRAM array 12 includes 4 columns and 8 rows.

The semiconductor device 10 may include a corner dummy cell 16 disposed at each of four corners of the SRAM array 12, and edge straps such as a word-line edge strap (WL edge strap) 18 disposed in a row edge of the SRAM array 12, and a bit-line edge strap (BL edge strap) 22 disposed in a column edge of the SRAM array 12. Each WL edge strap 18 may include a plurality of WL edge cells 20 arranged in a line along the first direction X. Each BL edge strap 22 may include a plurality of BL edge cells 24 arranged in a line along the second direction Y. The edge straps 18 and 22 may not be designed to function as the SRAM unit cells 14, but may be a circuit area designed to provide other functions.

Referring to FIG. 2, the SRAM unit cell 14 of the semiconductor device according to some embodiments includes a first inverter INV1 and a second inverter INV2 coupled to each other in a cross-coupled manner to store a bit of data. The SRAM unit cell 14 further includes a pass transistor electrically connected to the two inverters INV1 and INV2 for reading data from and writing data to the SRAM unit cell 14.

The first inverter INV1 and the second inverter INV2 are connected in parallel between a power node Vdd and a ground node Vss. A first pass transistor PS1 and a second pass transistor PS2 may be connected to output nodes of the first and second inverters INV1 and INV2, respectively.

The first pass transistor PS1 and the second pass transistor PS2 may be connected to a bit-line BL and a complementary bit-line BLB, respectively. Gates of the first pass transistor PS1 and the second pass transistor PS2 may be connected to a word-line WL.

The first inverter INV1 may include a first pullup transistor PU1 and a first pulldown transistor PD1 connected in series to and disposed between the power node Vdd and the ground node Vss. The second inverter INV2 may include a second pullup transistor PU2 and a second pulldown transistor PD2 connected in series to and disposed between the power node Vdd and the ground node Vss.

For example, each of the first pullup transistor PU1 and the second pullup transistor PU2 may be embodied as a P-type transistor, and each of the first pulldown transistor PD1 and the second pulldown transistor PD2 may be embodied as an N-type transistor. Each of the first pass transistor PS1 and the second pass transistor PS2 may be embodied as an N-type transistor.

Further, in order that the first inverter INV1 and the second inverter INV2 constitute one latch circuit, an input node of the first inverter INV1 is connected to an output node of the second inverter INV2, and an input node of the second inverter INV2 is connected to an output node of the first inverter INV1. That is, the first inverter INV1 and the second inverter INV2 are coupled to each other in a cross coupled manner to constitute a data storage circuit.

Referring to FIG. 2 to FIG. 10, a semiconductor device according to some embodiments may include active patterns AP1, AP2, AP3, and AP4, gate electrodes 120, 220, 320, and 420, isolated conductive lines 160, 260, and 360, bridge contacts 271 and 272, source/drain contacts 171, 172, 173, 174, 175, 176, 177, and 178, gate contacts 181, 182, 183, and 184, bridge wiring lines M1_C1 and M1_C2, front wiring lines M1_A, M1_B, M1_W1, M1_W2, and M1, and rear wiring lines BS_M11, BS_M12, and BS_M13.

A substrate 100 may include a first surface 100_S1 and a second surface 100_S2. The first surface 100_S1 of the substrate 100 and the second surface 100_S2 of the substrate 100 may be opposite to each other in a third direction Z. The third direction Z may represent a direction perpendicular to the upper surface of the substrate, and the Z-axis direction may include a direction perpendicular to an X-Y plane. For example, the first surface 100_S1 of the substrate 100 may be a frontside of the substrate 100, and the second surface 100_S2 of the substrate 100 may be a backside of the substrate 100. However, the present disclosure is not limited thereto.

For example, the above-described SRAM unit cell 14 may be disposed on the first surface 100_S1 of the substrate 100. Hereinafter, the first surface 100_S1 of the substrate 100 on which the SRAM unit cell 14 is disposed is referred to as a frontside of the substrate 100.

The active patterns AP1, AP2, AP3, and AP4, the gate electrodes 120, 220, 320, and 420, the isolated conductive lines 160, 260, and 360, the bridge contacts 271 and 272, the source/drain contacts 171, 172, 173, 174, 175, 176, 177, and 178, the gate contacts 181, 182, 183, and 184, the bridge wiring lines M1_C1 and M1_C2, and the front wiring lines M1_A, M1_B, M1_W1, M1_W2, and M1 may be disposed on the first surface 100_S1 of the substrate 100. The rear wiring lines BS_M11, BS_M12, and BS_M13 may be disposed on the second surface 100_S2 of the substrate 100.

The substrate 100 may be embodied as a silicon substrate or SOI (silicon-on-insulator). Alternatively, the substrate 100 may be made of a material other than silicon, such as silicon germanium, SGOI (silicon germanium on insulator), indium antimonide, lead telluride, indium arsenide, indium phosphide, gallium arsenide or gallium antimonide. However, the present disclosure may not be limited thereto.

The active patterns AP1, AP2, AP3, and AP4 may be disposed in the SRAM unit cell 14. The first active pattern AP1 and the third active pattern AP3 may be disposed in a PMOS area of the SRAM unit cell 14. The second active pattern AP2 and the fourth active pattern AP4 may be disposed in an NMOS area of the SRAM unit cell 14.

Each of the active patterns AP1, AP2, AP3, and AP4 may elongate in the first direction X. The first active pattern AP1 and the third active pattern AP3 may be disposed between the second active pattern AP2 and the fourth active pattern AP4 spaced apart from each other in the second direction Y.

The first active pattern AP1 may be spaced apart from the second active pattern AP2 and the third active pattern AP3 in the second direction Y. The third active pattern AP3 may be spaced apart from the fourth active pattern AP4 in the second direction Y. The first active pattern AP1 may overlap a portion of the third active pattern AP3 in the second direction Y. The first active pattern AP1 and the third active pattern AP3 may be arranged in a zigzag manner in the first direction X.

Each of the active patterns AP1, AP2, AP3, and AP4 may be a multi-channel active pattern. The first active pattern AP1 may include a first lower pattern BP1 and a plurality of first sheet patterns NS1. The second active pattern AP2 may include a second lower pattern BP2 and a plurality of second sheet patterns NS2. The third active pattern AP3 may include a third lower pattern BP3 and a plurality of third sheet patterns NS3. The fourth active pattern AP4 may include a fourth lower pattern BP4 and a plurality of fourth sheet patterns NS4.

Each of the lower patterns BP1, BP2, BP3, and BP4 may protrude from the first surface 100_S1 of the substrate 100. Each of the lower patterns BP1, BP2, BP3, and BP4 may extend in the first direction X. Each of the lower patterns BP1, BP2, BP3, and BP4 may have a fin-like pattern shape.

A width of an upper surface of the first lower pattern BP1 in the second direction Y may be equal to a width of an upper surface of the third lower pattern BP3 in the second direction Y. A width of an upper surface of the second lower pattern BP2 in the second direction Y may be equal to a width of an upper surface of the fourth lower pattern BP4 in the second direction Y.

For example, the width of the upper surface of the first lower pattern BP1 in the second direction Y may be equal to the width of the upper surface of the second lower pattern BP2 in the second direction Y. Unlike the illustration, the width of the upper surface of the first lower pattern BP1 in the second direction Y may be different from the width of the upper surface of the second lower pattern BP2 in the second direction Y.

The sheet patterns NS1, NS2, NS3, and NS4 may be disposed on upper surfaces of the lower patterns BP1, BP2, BP3, and BP4, respectively. The sheet patterns NS1, NS2, NS3, and NS4 may be respectively spaced apart from the lower patterns BP1, BP2, BP3, and BP4 in the third direction Z. It is illustrated that each of the sheet patterns NS1, NS2, NS3, and NS4 includes three sheet patterns arranged in the third direction Z. However, this is only for convenience of illustration, and the present disclosure is not limited thereto.

Each of the lower patterns BP1, BP2, BP3, and BP4 may be formed by etching a portion of the substrate 100, or may include an epitaxial layer grown from the substrate 100. Each of the lower patterns BP1, BP2, BP3, and BP4 may include silicon or germanium as an elemental semiconductor material. Further, each of the lower patterns BP1, BP2, BP3, and BP4 may include a compound semiconductor, for example, a group IV-IV compound semiconductor or a group III-V compound semiconductor.

The group IV-IV compound semiconductor may include, for example, a binary compound including two of carbon (C), silicon (Si), germanium (Ge), and tin (Sn), a ternary compound including three thereof, or a compound obtained by doping a group IV element thereto.

The group compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

Each of the sheet patterns NS1, NS2, NS3, and NS4 may include one of the elemental semiconductor such as silicon or germanium, the group IV-IV compound semiconductor, or the group compound semiconductor. Each of the sheet patterns NS1, NS2, NS3, and NS4 may include the same material as that of each of the lower patterns BP1, BP2, BP3, and BP4, or may include a material different from that of each of the lower patterns BP1, BP2, BP3, and BP4.

In the semiconductor device according to some embodiments, each of the lower patterns BP1, BP2, BP3 and BP4 may be a silicon lower pattern including silicon, and each of the sheet patterns NS1, NS2, NS3, and NS4 may be a silicon sheet pattern including silicon.

A field insulating film 105 may be disposed on the first surface 100_S1 of the substrate. The field insulating film 105 may be disposed on a sidewall of each of the lower patterns BP1, BP2, BP3, and BP4. The field insulating film 105 is not disposed on the upper surface of each of the lower patterns BP1, BP2, BP3, and BP4.

A vertical level of each of the sheet patterns NS1, NS2, NS3, and NS4 is higher than a vertical level of an upper surface of the field insulating film 105. The field insulating film 105 may include, for example, an oxide film, a nitride film, an oxynitride film, or a combination film thereof. Although it is illustrated that the field insulating film 105 is embodied as a single film, this is only for convenience of illustration, and the present disclosure is not limited thereto.

Each of a first conductive line structure 160ST, a second conductive line structure 260ST, and a third conductive line structure 360ST may be disposed on the first surface 100_S1 of the substrate 100. Each of the first conductive line structure 160ST, the second conductive line structure 260ST and the third conductive line structure 360ST may extend in the first direction X. A sidewall of each of the first conductive line structure 160ST, the second conductive line structure 260ST and the third conductive line structure 360ST may extend in the first direction X. Each of the first conductive line structure 160ST, the second conductive line structure 260ST, and the third conductive line structure 360ST may have a line shape.

The first conductive line structure 160ST, the second conductive line structure 260ST, and the third conductive line structure 360ST may pass through the field insulating film 105 and extend to the substrate 100 in the third direction Z. The first conductive line structure 160ST, the second conductive line structure 260ST and the third conductive line structure 360ST may be in contact with the substrate 100. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first conductive line structure 160ST may be disposed between the second conductive line structure 260ST and the third conductive line structure 360ST spaced apart from each other in the second direction Y. The first conductive line structure 160ST may be spaced apart from the second conductive line structure 260ST and the third conductive line structure 360ST in the second direction Y.

The first active pattern AP1 and the second active pattern AP2 may be disposed between the first conductive line structure 160ST and the second conductive line structure 260ST. The third active pattern AP3 and the fourth active pattern AP4 may be disposed between the first conductive line structure 160ST and the third conductive line structure 360ST. The first conductive line structure 160ST may be disposed between the first active pattern AP1 and the third active pattern AP3 adjacent to each other in the second direction Y.

The first conductive line structure 160ST may include a first isolated conductive line 160, a first isolation line insulating film 160SP, and a first isolation insulating capping film 160CAP. The second conductive line structure 260ST may include a second isolated conductive line 260, a second isolation line insulating film 260SP, and a second isolation insulating capping film 260CAP. The third conductive line structure 360ST may include a third isolated conductive line 360, a third isolation line insulating film 360SP, and a third isolation insulating capping film 360CAP.

Each of the isolated conductive lines 160, 260 and 360 extends in the first direction X. Each of the isolated conductive lines 160, 260 and 360 includes a sidewall extending in the first direction X. Each of the isolated conductive lines 160, 260 and 360 may extend up to the substrate 100 in the third direction Z.

The isolation line insulating films 160SP, 260SP, and 360SP are disposed on sidewalls of the isolated conductive lines 160, 260, and 360, respectively. The isolation line insulating films 160SP, 260SP, and 360SP may respectively separate the isolated conductive lines 160, 260, and 360 from the gate electrodes 120, 220, 320, and 420.

The isolation insulating capping films 160CAP, 260CAP, and 360CAP may be disposed on upper surfaces of the isolated conductive lines 160, 260, and 360, respectively. It is illustrated that the isolation insulating capping films 160CAP, 260CPA, and 360CAP are respectively disposed on the upper surfaces of the isolation line insulating films 160SP, 260SP, and 360SP. However, the present disclosure is not limited thereto.

Each of the isolated conductive lines 160, 260 and 360 may include a conductive material. Each of the isolated conductive lines 160, 260, and 360 may include, for example, at least one of a metal, a metal alloy, a conductive metal nitride, a conductive metal carbonitride, a metal silicide, a doped semiconductor material, a conductive metal oxide, and a conductive metal oxynitride.

Each of the isolation line insulating films 160SP, 260SP, and 360SP may be made of an insulating material. Each of the isolation line insulating films 160SP, 260SP, and 360SP may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof. It is illustrated that each of the isolation line insulating films 160SP, 260SP, and 360SP is as a single film. However, this is only for convenience of illustration and the present disclosure is not limited thereto.

Each of the isolation insulating capping films 160CAP, 260CAP, and 360CAP may be made of an insulating material. Each of the isolation insulating capping films 160CAP, 260CAP, 360CAP may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

Each of the gate electrodes 120, 220, 320, and 420 may extend in the second direction Y. The first gate electrode 120 may be spaced apart from the second gate electrode 220 in the first direction X. The third gate electrode 320 may be spaced apart from the fourth gate electrode 420 in the first direction X. The first gate electrode 120 and the fourth gate electrode 420 may be aligned with each other along the second direction Y. The second gate electrode 220 and the third gate electrode 320 may be aligned with each other along the second direction Y.

The first gate electrode 120 and the second gate electrode 220 may be disposed between the first conductive line structure 160ST and the second conductive line structure 260ST. The third gate electrode 320 and the fourth gate electrode 420 may be disposed between the first conductive line structure 160ST and the third conductive line structure 360ST.

The first conductive line structure 160ST is disposed between the first gate electrode 120 and the fourth gate electrode 420. The first gate electrode 120 and the fourth gate electrode 420 are separated in the second direction Y by the first conductive line structure 160ST. For example, the first isolated conductive line 160 of the first conductive line structure 160ST may be formed between the first gate electrode 120 and the fourth gate electrode 420 after cutting a portion of the first gate electrode 120 and the fourth gate electrode 420. The first conductive line structure 160ST is disposed between the second gate electrode 220 and the third gate electrode 320. The second gate electrode 220 and the third gate electrode 320 are separated in the second direction Y by the first conductive line structure 160ST. For example, the first isolated conductive line 160 of the first conductive line structure 160ST may be formed between the second gate electrode 220 and the third gate electrode 320 after cutting a portion of the second gate electrode 220 and the third gate electrode 320.

Although not shown, the second conductive line structure 260ST is disposed between the first gate electrode 120 of the SRAM unit cell 14 and a first gate electrode 120 of a SRAM unit cell adjacent to the SRAM unit cell 14. The first gate electrode 120 of the SRAM unit cell 14 and the first gate electrode 120 of the SRAM unit cell adjacent to the SRAM unit cell 14 are separated in the second direction Y by the second conductive line structure 260ST. For example, the second isolated conductive line 260 of the second conductive line structure 260ST may be formed between the first gate electrode 120 of the SRAM unit cell 14 and the first gate electrode 120 of the SRAM unit cell adjacent to the SRAM unit cell 14 after cutting a portion of the first gate electrode 120 of the SRAM unit cell 14 and the first gate electrode 120 of the SRAM unit cell adjacent to the SRAM unit cell 14. The second conductive line structure 260ST is disposed between the second gate electrode 220 of the SRAM unit cell 14 and a second gate electrode 220 of the SRAM unit cell adjacent to the SRAM unit cell 14. The second gate electrode 220 of the SRAM unit cell 14 and the second gate electrode 220 of the SRAM unit cell adjacent to the SRAM unit cell 14 are separated in the second direction Y by the second conductive line structure 260ST. For example, the second isolated conductive line 260 of the second conductive line structure 260ST may be formed between the second gate electrode 220 of the SRAM unit cell 14 and the second gate electrode 220 of the SRAM unit cell adjacent to the SRAM unit cell 14 after cutting a portion of the second gate electrode 220 of the SRAM unit cell 14 and the second gate electrode 220 of the SRAM unit cell adjacent to the SRAM unit cell 14.

Although not shown, the third conductive line structure 360ST is disposed between the fourth gate electrode 420 of the SRAM unit cell 14 and a fourth gate electrode 420 of a SRAM unit cell adjacent to the SRAM unit cell 14. The fourth gate electrode 420 of the SRAM unit cell 14 and the fourth gate electrode 420 of the SRAM unit cell adjacent to the SRAM unit cell 14 are separated in the second direction Y by the third conductive line structure 360ST. For example, the third isolated conductive line 360 of the third conductive line structure 360ST may be formed between the fourth gate electrode 420 of the SRAM unit cell 14 and the fourth gate electrode 420 of the SRAM unit cell adjacent to the SRAM unit cell 14 after cutting a portion of the fourth gate electrode 420 of the SRAM unit cell 14 and the fourth gate electrode 420 of the SRAM unit cell adjacent to the SRAM unit cell 14. The third conductive line structure 360ST is disposed between the third gate electrode 320 of the SRAM unit cell 14 and a third gate electrode 320 of a SRAM unit cell adjacent to the SRAM unit cell 14. The third gate electrode 320 of the SRAM unit cell 14 and the third gate electrode 320 of the SRAM unit cell adjacent to the SRAM unit cell 14 are separated in the second direction Y by the third conductive line structure 360ST. For example, the third isolated conductive line 360 of the third conductive line structure 360ST may be formed between the third gate electrode 320 of the SRAM unit cell 14 and the third gate electrode 320 of the SRAM unit cell adjacent to the SRAM unit cell 14 after cutting a portion of the third gate electrode 320 of the SRAM unit cell 14 and the third gate electrode 320 of the SRAM unit cell adjacent to the SRAM unit cell 14.

The first gate electrode 120 includes a first short sidewall 120SW1 and a second short sidewall 120SW2 opposite to each other in the second direction Y. The second gate electrode 220 includes a first short sidewall 220SW1 and a second short sidewall 220SW2 opposite to each other in the second direction Y. The first short sidewall 120SW1 of the first gate electrode 120 and the first short sidewall 220SW1 of the second gate electrode 220 face a sidewall of the second conductive line structure 260ST. The second short sidewall 120SW2 of the first gate electrode 120 and the second short sidewall 220SW2 of the second gate electrode 220 face a sidewall of the first conductive line structure 160ST.

The third gate electrode 320 includes a first short sidewall 320SW1 and a second short sidewall 320SW2 opposite to each other in the second direction Y. The fourth gate electrode 420 includes a first short sidewall 420SW1 and a second short sidewall 420SW2 opposite to each other in the second direction Y. The first short sidewall 320SW1 of the third gate electrode 320 and the first short sidewall 420SW1 of the fourth gate electrode 420 face a sidewall of the third conductive line structure 360ST. The second short sidewall 320SW2 of the third gate electrode 320 and the second short sidewall 420SW2 of the fourth gate electrode 420 face a sidewall of the first conductive line structure 160ST.

Each of the first gate electrode 120 and the second gate electrode 220 may intersect the first active pattern AP1 and the second active pattern AP2. Each of the third gate electrode 320 and the fourth gate electrode 420 may intersect the third active pattern AP3 and the fourth active pattern AP4.

Each of the first gate electrode 120 and the second gate electrode 220 may intersect the first lower pattern BP1 and the second lower pattern BP2. Each of the first gate electrode 120 and the second gate electrode 220 may surround the first sheet pattern NS1 and the second sheet pattern NS2.

Each of the third gate electrode 320 and the fourth gate electrode 420 may intersect the third lower pattern BP3 and the fourth lower pattern BP4. Each of the third gate electrode 320 and the fourth gate electrode 420 may surround the third sheet pattern NS3 and the fourth sheet pattern NS4.

Each of the gate electrodes 120, 220, 320, and 420 may include, for example, at least one of a metal, a metal alloy, a conductive metal nitride, a conductive metal carbonitride, a metal silicide, a doped semiconductor material, a conductive metal oxide, and a conductive metal oxynitride.

The first pullup transistor PU1 is defined around an area where the first gate electrode 120 and the first active pattern AP1 intersect each other. The first pulldown transistor PD1 is defined around an area where the first gate electrode 120 and the second active pattern AP2 intersect each other. The first pass transistor PS1 is defined around an area where the second gate electrode 220 and the second active pattern AP2 intersect each other.

The first pullup transistor PU1 and the first pulldown transistor PD1 may include the first gate electrode 120. The first inverter INV1 including the first pullup transistor PU1 and the first pulldown transistor PD1 includes the first gate electrode 120. The first pass transistor PS1 may include the second gate electrode 220.

Since the first gate electrode 120, the second gate electrode 220, the first active pattern AP1 and the second active pattern AP2 are disposed between the first conductive line structure 160ST and the second conductive line structure 260ST, the first pullup transistor PU1, the first pulldown transistor PD1, and the first pass transistor PS1 may be disposed between the first conductive line structure 160ST and the second conductive line structure 260ST. For example, the first inverter INV1 and the first pass transistor PS1 may be disposed between the first conductive line structure 160ST and the second conductive line structure 260ST.

The second pullup transistor PU2 is defined around an area where the third gate electrode 320 and the third active pattern AP3 intersect each other. The second pulldown transistor PD2 is defined around an area where the third gate electrode 320 and the fourth active pattern AP4 intersect each other. The second pass transistor PS2 is defined around an area where the fourth gate electrode 420 and the fourth active pattern AP4 intersect each other.

The second pullup transistor PU2 and the second pulldown transistor PD2 may include the third gate electrode 320. The second inverter INV2 including the second pullup transistor PU2 and the second pulldown transistor PD2 includes the third gate electrode 320. The second pass transistor PS2 may include the fourth gate electrode 420.

Since the third gate electrode 320, the fourth gate electrode 420, the third active pattern AP3 and the fourth active pattern AP4 are disposed between the first conductive line structure 160ST and the third conductive line structure 360ST, the second pullup transistor PU2, the second pulldown transistor PD2, and the second pass transistor PS2 may be disposed between the first conductive line structure 160ST and the third conductive line structure 360ST. For example, the second inverter INV2 and the second pass transistor PS2 may be disposed between the first conductive line structure 160ST and the third conductive line structure 360ST.

A first gate insulating film 130 may be disposed between the first gate electrode 120 and the first active pattern AP1 and between the first gate electrode 120 and the second active pattern AP2. A second gate insulating film 230 may be disposed between the second gate electrode 220 and the first active pattern AP1 and between the second gate electrode 220 and the second active pattern AP2. A third gate insulating film 330 may be disposed between the third gate electrode 320 and the third active pattern AP3 and between the third gate electrode 320 and the fourth active pattern AP4. A fourth gate insulating film 430 may be disposed between the fourth gate electrode 420 and the third active pattern AP3 and between the fourth gate electrode 420 and the fourth active pattern AP4.

Each of the first to fourth gate insulating films 130, 230, 330, and 430 may include at least one of silicon oxide, silicon oxynitride, silicon nitride, and a high dielectric constant (high-k) material having a higher dielectric constant than that of silicon oxide. The high-k material may include at least one of, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The semiconductor device according to some embodiments may include an NC (negative capacitance) FET using a negative capacitor. For example, each of the first to fourth gate insulating films 130, 230, 330, and 430 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain about 3 to about 8 at % (atomic %) of aluminum. In this connection, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide. However, the present disclosure is not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. Although the thickness of the ferroelectric material film may be, for example, in a range of about 0.5 to about 10 nm, the present disclosure is not limited thereto. Because a critical thickness exhibiting the ferroelectric properties may be vary based on a type of the ferroelectric material, the thickness of the ferroelectric material film may vary depending on the type of the ferroelectric material.

In one example, each of the first to fourth gate insulating films 130, 230, 330, and 430 may include one ferroelectric material film. In another example, each of the first to fourth gate insulating films 130, 230, 330, and 430 may include a plurality of ferroelectric material films spaced apart from each other. Each of the first to fourth gate insulating films 130, 230, 330, and 430 may have a multilayer structure in which a plurality of ferroelectric material films and a plurality of paraelectric material films are alternately stacked on top of each other.

A first gate spacer 140 may be disposed on a sidewall of the first gate electrode 120 extending in the second direction Y. A second gate spacer 240 may be disposed on a sidewall of the second gate electrode 220 extending in the second direction Y. Although not shown, a gate spacer may be disposed on each of a sidewall of the third gate electrode 320 and a sidewall of the fourth gate electrode 420.

Each of the first and second gate spacers 140 and 240 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof. The present disclosure is not limited thereto. Although it is illustrated that each of the first and second gate spacers 140 and 240 is as a single film, this is only for convenience of illustration and the present disclosure is not limited thereto.

A first gate capping pattern 145 may be disposed on the first gate electrode 120. A second gate capping pattern 245 may be disposed on the second gate electrode 220. A third gate capping pattern 345 may be disposed on the third gate electrode 320. A fourth gate capping pattern 445 may be disposed on the fourth gate electrode 420. Each of the first to fourth gate capping patterns 145, 245, 345, and 445 may include, for example, at least one of silicon nitride (SiN), silicon oxynitride (SiON), silicon carbonitride (SiCN), silicon oxycarbonitride (SiOCN), and combinations thereof.

Each of a first source/drain pattern 150_1 and a second source/drain pattern 150_2 may be disposed on the first active pattern AP1. The first source/drain pattern 150_1 and the second source/drain pattern 150_2 may be included in a source/drain area of the first pullup transistor PU1. For example, the first source/drain pattern 150_1 and the second source/drain pattern 150_2 may be included in the first pullup transistor PU1.

Each of third to fifth source/drain patterns 250_1, 250_2, and 250_3 may be disposed on the second active pattern AP2. The third source/drain pattern 250_1 may be included in the first pass transistor PS1. The fifth source/drain pattern 250_3 may be included in the first pulldown transistor PD1. The fourth source/drain pattern 250_2 may be included in the first pass transistor PS1 and the first pulldown transistor PD1.

Each of a sixth source/drain pattern 350_1 and a seventh source/drain pattern 350_2 may be disposed on the third active pattern AP3. The sixth source/drain pattern 350_1 and the seventh source/drain pattern 350_2 may be included in the second pullup transistor PU2.

Each of eighth to tenth source/drain patterns 450_1, 450_2, and 450_3 may be disposed on the fourth active pattern AP4. The eighth source/drain pattern 450_1 may be included in the second pulldown transistor PD2. The tenth source/drain pattern 450_3 may be included in the second pass transistor PS2. The ninth source/drain pattern 450_2 may be included in the second pass transistor PS2 and the second pulldown transistor PD2.

An interlayer insulating film 190 is disposed on the source/drain patterns 150_1, 150_2, 250_1, 250_2, 250_3, 350_1, 350_2, 450_1, 450_2, and 450_3. The interlayer insulating film 190 may include, for example, at least one of silicon oxide, silicon nitride, silicon oxynitride, and a low dielectric constant (low-k) material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or a combination thereof. The present disclosure is not limited thereto.

A first source/drain contact 171 may be disposed on the first source/drain pattern 150_1 and the fourth source/drain pattern 250_2. The first source/drain contact 171 connects the first source/drain pattern 150_1 and the fourth source/drain pattern 250_2 to each other. The first source/drain contact 171 is connected to a source/drain area of the first pullup transistor PU1, a source/drain area of the first pulldown transistor PD1, and a source/drain area of the first pass transistor PS1.

A second source/drain contact 172 may be disposed on the seventh source/drain pattern 350_2 and the ninth source/drain pattern 450_2. The second source/drain contact 172 connects the seventh source/drain pattern 350_2 and the ninth source/drain pattern 450_2. The second source/drain contact 172 is connected to a source/drain area of the second pullup transistor PU2, a source/drain area of the second pulldown transistor PD2, and a source/drain area of the second pass transistor PS2.

A third source/drain contact 173 may be disposed on the second source/drain pattern 150_2. The third source/drain contact 173 connects the second source/drain pattern 150_2 and the first isolated conductive line 160 to each other. The third source/drain contact 173 is connected to a source/drain area of the first pullup transistor PU1 and the first isolated conductive line 160. The third source/drain contact 173 may contact the first isolated conductive line 160.

A fourth source/drain contact 174 may be disposed on the sixth source/drain pattern 350_1. The fourth source/drain contact 174 connects the sixth source/drain pattern 350_1 and the first isolated conductive line 160 to each other. The fourth source/drain contact 174 is connected to a source/drain area of the second pullup transistor PU2 and the first isolated conductive line 160. The fourth source/drain contact 174 may contact the first isolated conductive line 160.

A fifth source/drain contact 175 may be disposed on the tenth source/drain pattern 450_3. The fifth source/drain contact 175 is connected to the tenth source/drain pattern 450_3.

A sixth source/drain contact 176 may be disposed on the third source/drain pattern 250_1. The sixth source/drain contact 176 is connected to the third source/drain pattern 250_1.

A seventh source/drain contact 177 may be disposed on the fifth source/drain pattern 250_3. The seventh source/drain contact 177 connects the fifth source/drain pattern 250_3 and the second isolated conductive line 260. The seventh source/drain contact 177 is connected to a source/drain area of the first pulldown transistor PD1 and the second isolated conductive line 260. The seventh source/drain contact 177 may be in contact with the second isolated conductive line 260.

An eighth source/drain contact 178 may be disposed on the eighth source/drain pattern 450_1. The eighth source/drain contact 178 connects the eighth source/drain pattern 450_1 and the third isolated conductive line 360 to each other. The eighth source/drain contact 178 is connected to a source/drain area of the second pulldown transistor PD2 and the third isolated conductive line 360. The eighth source/drain contact 178 may contact the third isolated conductive line 360.

A height from the first surface 100_S1 of the substrate 100 to an upper surface of each of the source/drain contacts 171, 172, 173, 174, 175, 176, 177, and 178 may be greater than that from the first surface 100_S1 of the substrate 100 to an upper surface of each of the gate electrodes 120, 220, 320, and 420. The height from the first surface 100_S1 of the substrate to the upper surface of each of the source/drain contacts 171, 172, 173, 174, 175, 176, 177, and 178 may be greater than that from the first surface 100_S1 of the substrate to an upper surface of each of the isolated conductive lines 160, 260, and 360.

It is illustrated that each of the source/drain contacts 171, 172, 173, 174, 175, 176, 177, and 178 is as a single layer. However, the present disclosure is not limited thereto. Each of the source/drain contacts 171, 172, 173, 174, 175, 176, 177, and 178 may include at least one of, for example, a metal, a metal alloy, a conductive metal nitride, a conductive metal carbonitride, a metal silicide, a doped semiconductor material, a conductive metal oxide, and a conductive metal oxynitride.

The first gate contact 181 is disposed on the first gate electrode 120. The first gate contact 181 may pass through the first gate capping pattern 145 to be connected to the first gate electrode 120. The first gate contact 181 is connected to a gate electrode of the first pullup transistor PU1 and a gate electrode of the first pulldown transistor PD1.

The second gate contact 182 is disposed on the third gate electrode 320. The second gate contact 182 may pass through the third gate capping pattern 345 to be connected to the third gate electrode 320. The second gate contact 182 is connected to a gate electrode of the second pullup transistor PU2 and a gate electrode of the second pulldown transistor PD2.

The third gate contact 183 is disposed on the second gate electrode 220. The third gate contact 183 may pass through the second gate capping pattern 245 to be connected to the second gate electrode 220. The third gate contact 183 is connected to a gate electrode of the first pass transistor PS1.

The fourth gate contact 184 is disposed on the fourth gate electrode 420. The fourth gate contact 184 may pass through the fourth gate capping pattern 445 to be connected to the fourth gate electrode 420. The fourth gate contact 184 is connected to a gate electrode of the second pass transistor PS2.

It is illustrated that each of the gate contacts 181, 182, 183, and 184 is as a single layer. However, the present disclosure is not limited thereto. Each of the gate contacts 181, 182, 183, and 184 may include, for example, at least one of a metal, a metal alloy, a conductive metal nitride, a conductive metal carbonitride, a metal silicide, a doped semiconductor material, a conductive metal oxide, and a conductive metal oxynitride.

A first connection structure may include the first bridge contact 271 and the second bridge wiring line M1_C2.

The first bridge contact 271 is disposed on the first source/drain contact 171. The first bridge contact 271 is connected to the first source/drain contact 171. The first bridge contact 271 extends in the first direction X. A portion of the first bridge contact 271 may overlap the second gate electrode 220 in the third direction Z. Since the first bridge contact 271 is spaced apart from the second gate electrode 220 in the third direction Z, the first bridge contact 271 is not connected to the second gate electrode 220.

The second bridge wiring line M1_C2 is disposed on the first bridge contact 271. The second bridge wiring line M1_C2 may be disposed on the interlayer insulating film 190. The second bridge wiring line M1_C2 extends in the second direction Y. The second bridge wiring line M1_C2 is disposed on an upper surface of the first conductive line structure 160ST. The second bridge wiring line M1_C2 intersects the first conductive line structure 160ST on the first conductive line structure 160ST.

The second bridge wiring line M1_C2 is connected to the first bridge contact 271 and the second gate contact 182. The second bridge wiring line M1_C2 connects the first source/drain contact 171 and the second gate contact 182 to each other.

The third gate electrode 320 is connected to the first source/drain pattern 150_1 and the fourth source/drain pattern 250_2 by the first source/drain contact 171, the first bridge contact 271 and the second bridge wiring line M1_C2. A gate electrode included in the second inverter INV2 is connected to the source/drain area of the first pullup transistor PU1, the source/drain area of the first pulldown transistor PD1, and the source/drain area of the first pass transistor PS1 by the first source/drain contact 171, the first bridge contact 271 and the second bridge wiring line M1_C2.

A second connection structure may include the second bridge contact 272 and the first bridge wiring line M1_C1.

The second bridge contact 272 is disposed on the second source/drain contact 172. The second bridge contact 272 is connected to the second source/drain contact 172. The second bridge contact 272 extends in the first direction X. A portion of the second bridge contact 272 may overlap the fourth gate electrode 420 in the third direction Z. Since the second bridge contact 272 is spaced apart from the fourth gate electrode 420 in the third direction Z, the second bridge contact 272 is not connected to the fourth gate electrode 420.

The first bridge wiring line M1_C1 is disposed on the second bridge contact 272. The first bridge wiring line M1_C1 may be disposed on the interlayer insulating film 190. The first bridge wiring line M1_C1 extends in the second direction Y. The first bridge wiring line M1_C1 is disposed on an upper surface of the first conductive line structure 160ST. The first bridge wiring line M1_C1 intersects the first conductive line structure 160ST on the first conductive line structure 160ST.

The first bridge wiring line M1_C1 is connected to the second bridge contact 271 and the first gate contact 181. The first bridge wiring line M1_C1 connects the second source/drain contact 172 and the first gate contact 181 to each other.

The first gate electrode 120 is connected to the seventh source/drain pattern 350_2 and the ninth source/drain pattern 450_2 by the second source/drain contact 172, the second bridge contact 272 and the first bridge wiring line M1_C1. A gate electrode included in the first inverter INV1 is connected to the source/drain area of the second pullup transistor PU2, the source/drain area of the second pulldown transistor PD2 and the source/drain area of the second pass transistor PS2 by the second source/drain contact 172, the second bridge contact 272 and the first bridge wiring line M1_C1.

The first word-line wiring line M1_W1 and the second word-line wiring line M1_W2 are disposed on the first surface 100_S1 of the substrate 100. The first word-line wiring line M1_W1 and the second word-line wiring line M1_W2 may be disposed on the interlayer insulating film 190.

The first word-line wiring line M1_W1 is connected to the third gate contact 183. The second gate electrode 220 is connected to the first word-line wiring line M1_W1 by the third gate contact 183. A gate electrode included in the first pass transistor PS1 is connected to the first word-line wiring line M1_W1.

The second word-line wiring line M1_W2 is connected to the fourth gate contact 184. The fourth gate electrode 420 is connected to the second word-line wiring line M1_W2 by the fourth gate contact 184. A gate electrode included in the second pass transistor PS2 is connected to the second word-line wiring line M1_W2.

The first word-line wiring line M1_W1 and the second word-line wiring line M1_W2 may be included in word-line (WL of FIG. 1).

The first wiring line M1_A may be disposed on the interlayer insulating film 190. The first wiring line M1_A may extend in the first direction X. In the semiconductor device according to some embodiments, the first wiring line M1_A may be a first bit-line. For example, the first wiring line M1_A may be included in the bit-line (BL of FIG. 1).

The first wiring line M1_A may be connected to the sixth source/drain contact 176 by a first wiring via V1_A. The first pass transistor PS1 may be connected to the first wiring line M1_A disposed on the first surface 100_S1 of the substrate 100. The source/drain area of the first pass transistor PS1 may be connected to the first bit-line disposed on the first surface 100_S1 of the substrate 100.

The second wiring line M1_B may be disposed on the interlayer insulating film 190. The second wiring line M1_B may extend in the first direction X. The second wiring line M1_B may be a second bit-line. For example, the second wiring line M1_B may be included in the complementary bit-line (BLB in FIG. 1).

The second wiring line M1_B may be connected to the fifth source/drain contact 175 via a second wiring via V1_B. The second pass transistor PS2 may be connected to the second wiring line M1_B disposed on the first surface 100_S1 of the substrate 100. The source/drain area of the second pass transistor PS2 may be connected to the second bit-line disposed on the first surface 100_S1 of the substrate 100.

A spare wiring line M1 may be disposed on the interlayer insulating film 190. The spare wiring line M1 may not be connected to the inverters INV1 and INV2 and the pass transistors PS1 and PS2 included in the SRAM unit cell 14 shown in FIG. 3. Although not shown, the spare wiring line M1 may be connected to a transistor included in a SRAM unit cell adjacent to the SRAM unit cell 14 shown in FIG. 3.

Each of the bridge wiring lines M1_C1 and M1_C2, the front wiring lines M1_A, M1_B, M1_W1, M1_W2, and M1, the bridge contacts 271 and 272 may include, for example, at least one of metal, metal alloy, conductive metal nitride, conductive metal carbonitride, metal silicide, doped semiconductor material, conductive metal oxide and conductive metal oxynitride.

The first rear wiring line BS_M11, the second rear wiring line BS_M12, and the third rear wiring line BS_M13 may be disposed on the second surface 100_S2 of the substrate 100.

Each of the first rear wiring line BS_M11, the second rear wiring line BS_M12, and the third rear wiring line BS_M13 may extend in the first direction X. Unlike the illustration, each of the first rear wiring line BS_M11, the second rear wiring line BS_M12, and the third rear wiring line BS_M13 may extend in the second direction Y. Following description is based on an example in which each of the first rear wiring line BS_M11, the second rear wiring line BS_M12, and the third rear wiring line BS_M13 extends in the first direction X.

The first rear wiring line BS_M11 is connected to the first conductive line structure 160ST. The first rear wiring line BS_M11 is connected to the first isolated conductive line 160. The first rear wiring line BS_M11 may be connected to the first isolated conductive line 160 via a first through pattern THP1 passing through the substrate 100.

The first through pattern THP1 may have a line shape. For example, the first through pattern THP1 may extend in the first direction X.

The second rear wiring line BS_M12 is connected to the second conductive line structure 260ST. The second rear wiring line BS_M12 is connected to the second isolated conductive line 260. The second rear wiring line BS_M12 may be connected to the second isolated conductive line 260 via a second through pattern THP2 passing through the substrate 100.

The third rear wiring line BS_M13 is connected to the third conductive line structure 360ST. The third rear wiring line BS_M13 is connected to the third isolated conductive line 360. The third rear wiring line BS_M13 may be connected to the third isolated conductive line 360 via a third through pattern THP3 passing through the substrate 100.

In the semiconductor device according to some embodiments, the first rear wiring line BS_M11 may be a first power line, the second rear wiring line BS_M12 may be a second power line, and the third rear wiring line BS_M13 may be a third power line.

The first rear wiring line BS_M11 may be, for example, a high power line PW_L1. For example, the first rear wiring line BS_M11 may be a power node (Vdd in FIG. 1).

Each of the second rear wiring line BS_M12 and the third rear wiring line BS_M13 may be a low power line PW_L2.

For example, each of the second rear wiring line BS_M12 and the third rear wiring line BS_M13 may be the ground node (Vss of FIG. 1).

The first pullup transistor PU1 and the second pullup transistor PU2 may be connected to the first rear wiring line BS_M11. The second source/drain pattern 150_2 of the first pullup transistor PU1 may be connected to the first rear wiring line BS_M11 via the third source/drain contact 173, the first isolated conductive line 160, and the first through pattern THP1. The sixth source/drain pattern 350_1 of the second pullup transistor PU2 may be connected to the first rear wiring line BS_M11 via the fourth source/drain contact 174, the first isolated conductive line 160, and the first through pattern THP1.

The first pulldown transistor PD1 may be connected to the second rear wiring line BS_M12. The fifth source/drain pattern 250_3 of the first pulldown transistor PD1 may be connected with the second rear wiring line BS_M12 via the seventh source/drain contact 177, the second isolated conductive line 260 and the second through pattern THP2.

The second pulldown transistor PD2 may be connected to the third rear wiring line BS_M13. The eighth source/drain pattern 450_1 of the second pulldown transistor PD2 may be connected to the third rear wiring line BS_M13 via the eighth source/drain contact 178, the third isolated conductive line 360 and the third through pattern THP3.

Each of the rear wiring line BS_M11, BS_M12, and BS_M13 and the through patterns THP1, THP2, and THP3 may include, for example, at least one of metal, metal alloy, conductive metal nitride, conductive metal carbonitride, metal silicide, doped semiconductor material, conductive metal oxide, and conductive metal oxynitride.

Although not shown in FIG. 3, the front wiring line connected to the gate electrodes 120, 220, 320, and 420 may be connected to a PMOS or a NMOS additionally disposed in addition to the transistor shown in FIG. 3.

Although not shown in FIG. 3, the front wiring line connected to the source/drain contacts 171 and 172 may be connected to a PMOS or a NMOS additionally disposed in addition to the transistor shown in FIG. 3.

Figure 11:
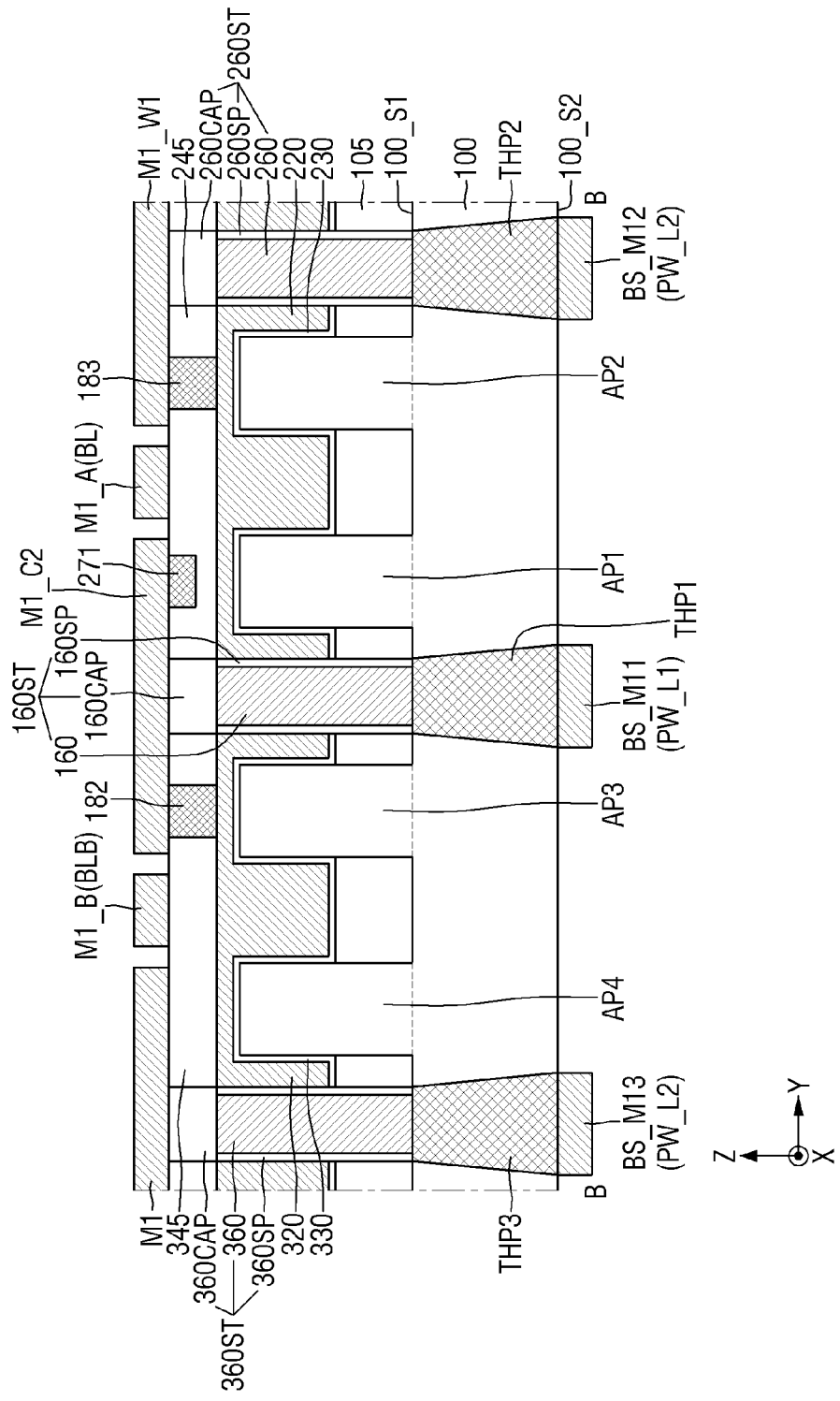
FIG. 11 is a diagram for illustrating a semiconductor device according to some embodiments.
Figure 12:
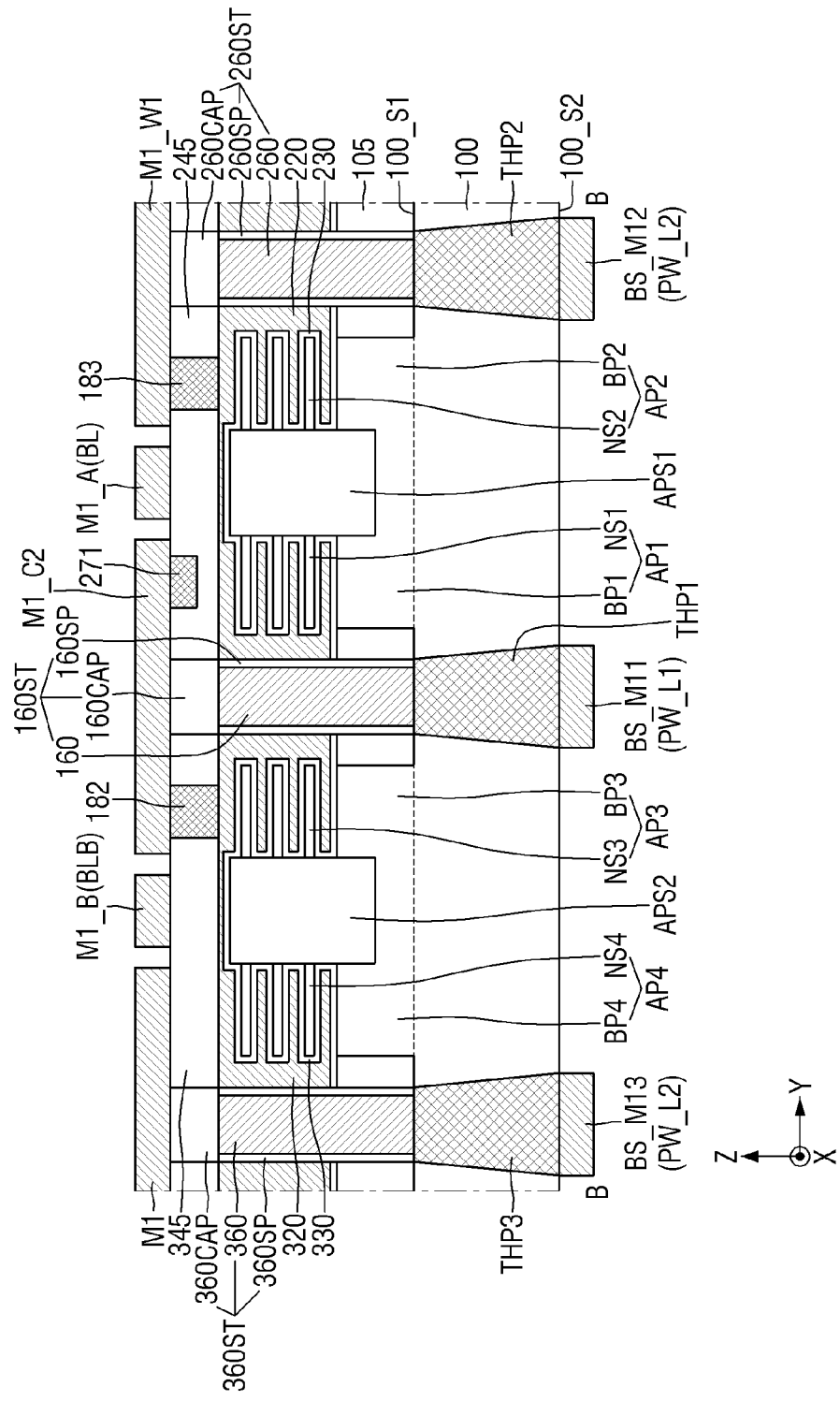
FIG. 12 and FIG. 13 are diagrams for illustrating a semiconductor device according to some embodiments.
Figure 13:
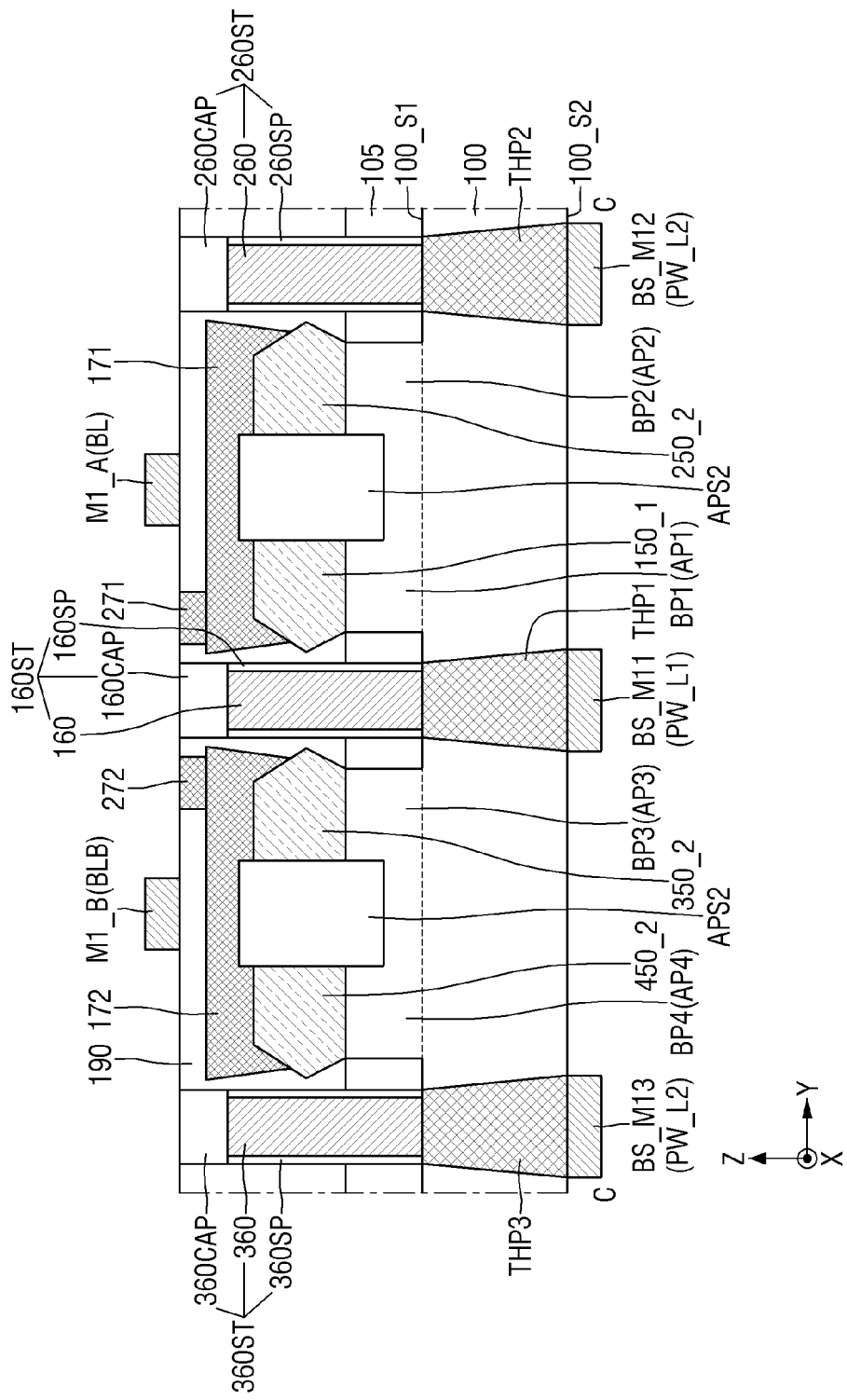
Figure 14:
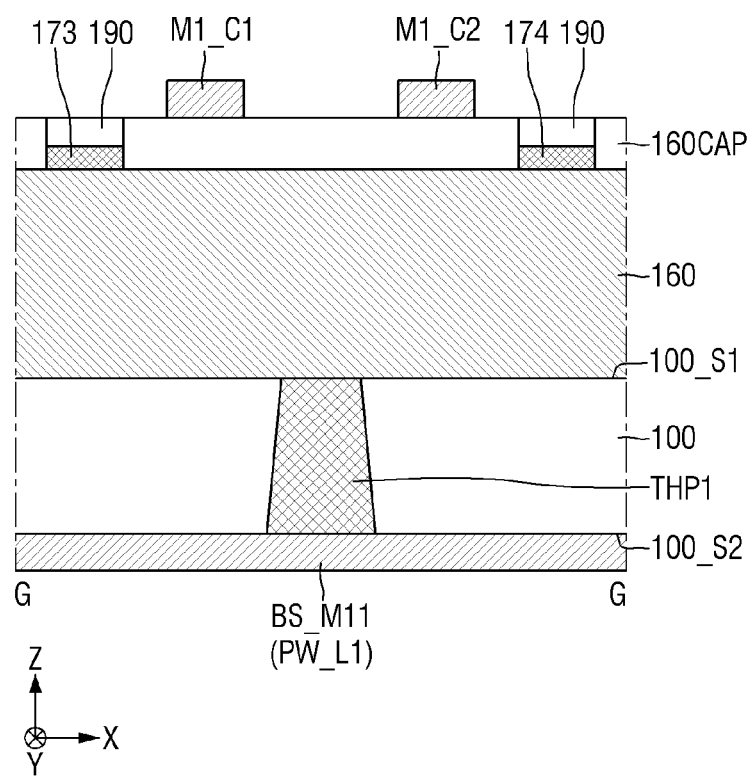
FIG. 14 is a diagram for illustrating a semiconductor device according to some embodiments.

FIG. 11 is a diagram for illustrating a semiconductor device according to some embodiments. FIG. 12 and FIG. 13 are diagrams for illustrating a semiconductor device according to some embodiments. FIG. 14 is a diagram for illustrating a semiconductor device according to some embodiments. For convenience of description, following description is based on differences thereof from those as described above with reference to FIG. 1 to FIG. 10.

Referring to FIG. 11, in the semiconductor device according to some embodiments, each of the first to fourth active patterns AP1, AP2, AP3, and AP4 may not include the sheet pattern.

A portion of each of the first to fourth active patterns AP1, AP2, AP3, and AP4 protruding from the first surface 100_S1 of the substrate 100 protrudes in the third direction Z beyond the upper surface of the field insulating film 105.

The portion of each of the first to fourth active patterns AP1, AP2, AP3, and AP4 protruding beyond the upper surface of the field insulating film 105 may act as a channel area of the transistor.

In an area between the first conductive line structure 160ST and the second conductive line structure 260ST, the number of the active patterns disposed in the NMOS area may be equal to the number of the active patterns disposed in the PMOS area.

Unlike the illustration, in the area between the first conductive line structure 160ST and the second conductive line structure 260ST, the number of the active patterns disposed in the NMOS area may be different from the number of the active patterns disposed in the PMOS area.

Referring to FIG. 12 and FIG. 13, the semiconductor device according to some embodiments may further include a first active pattern separation structure APS1 and a second active pattern separation structure APS2.

The first active pattern separation structure APS1 may extend in the first direction X. The first active pattern separation structure APS1 may separate the first active pattern AP1 and the second active pattern AP2 from each other.

The second active pattern separation structure APS2 may extend in the first direction X. The second active pattern separation structure APS2 may separate the third active pattern AP3 and the fourth active pattern AP4 from each other.

The first sheet pattern NS1 and the second sheet pattern NS2 contact a sidewall of the first active pattern separation structure APS1. The first sheet pattern NS1 and the second sheet pattern NS2 may protrude from the sidewall of the first active pattern separation structure APS1 in the second direction Y.

The third sheet pattern NS3 and the fourth sheet pattern NS4 are in contact with a sidewall of the second active pattern separation structure APS2. The third sheet pattern NS3 and the fourth sheet pattern NS4 may protrude from the sidewall of the second active pattern separation structure APS2 in the second direction Y.

A vertical level of an upper surface of the first active pattern separation structure APS1 may be higher than that of an upper surface of the uppermost first sheet pattern NS1. A vertical level of an upper surface of the second active pattern separation structure APS2 may be higher than that of an upper surface of the uppermost third sheet pattern NS3.

In FIG. 13, the first source/drain pattern 150_1 and the fourth source/drain pattern 250_2 may contact the first active pattern separation structure APS1. The seventh source/drain pattern 350_2 and the ninth source/drain pattern 450_2 may contact the second active pattern separation structure APS2.

Each of the first active pattern separation structure APS1 and the second active pattern separation structure APS2 may include, for example, at least one of silicon nitride (SiN), silicon oxynitride (SiON), silicon oxide (SiO₂), silicon oxycarbonitride (SiOCN), silicon boronitride (SiBN), silicon oxyboronitride (SiOBN), silicon oxycarbide (SiOC), and combinations thereof.

Referring to FIG. 14, in the semiconductor device according to some embodiments, the first through pattern THP1 may have a contact shape.

Although not shown, each of the second through pattern THP2 and the third through pattern THP3 may have a contact shape instead of a line shape.

Figure 15:
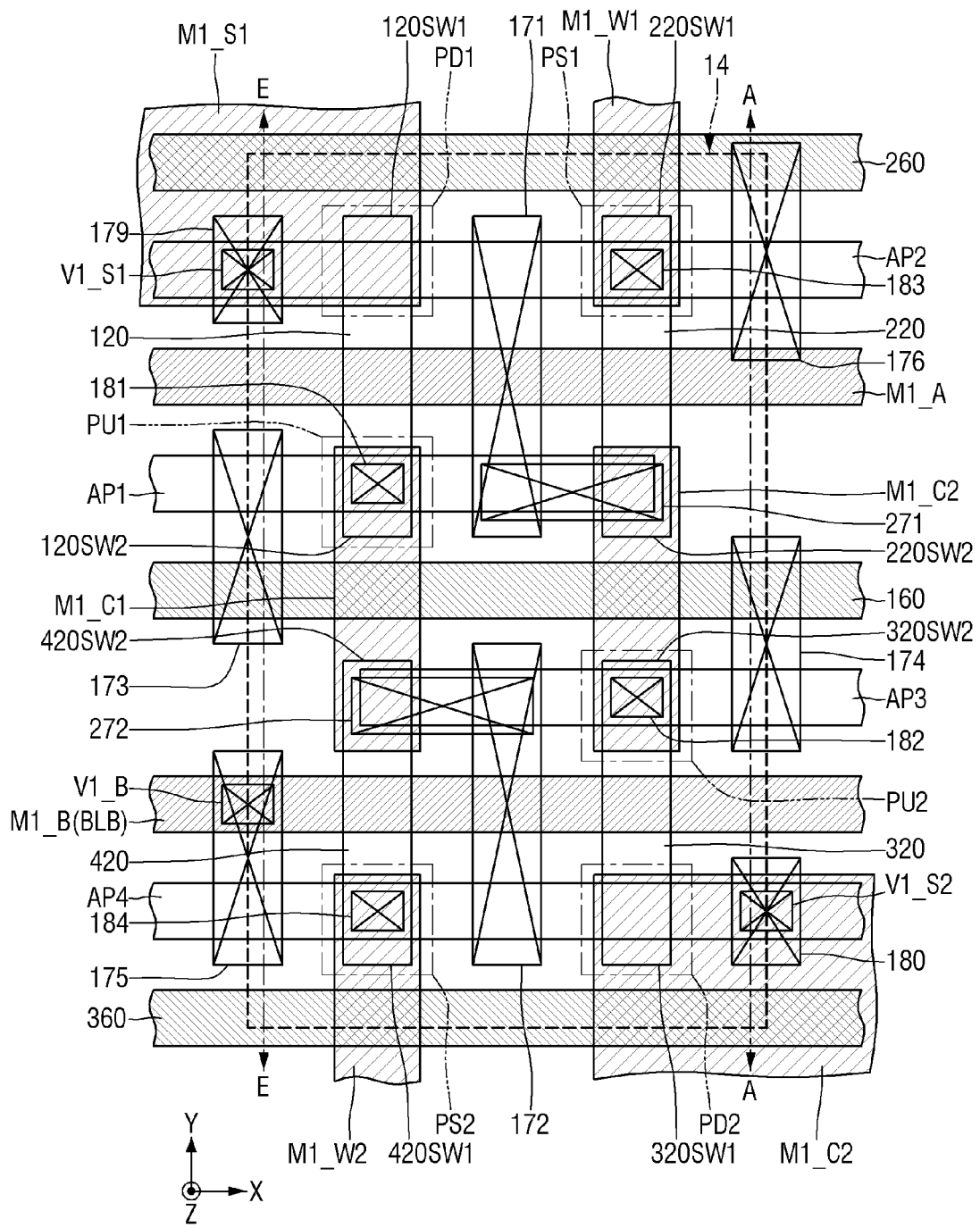
FIG. 15 to FIG. 17 are diagrams for illustrating a semiconductor device according to some embodiments.
Figure 16:
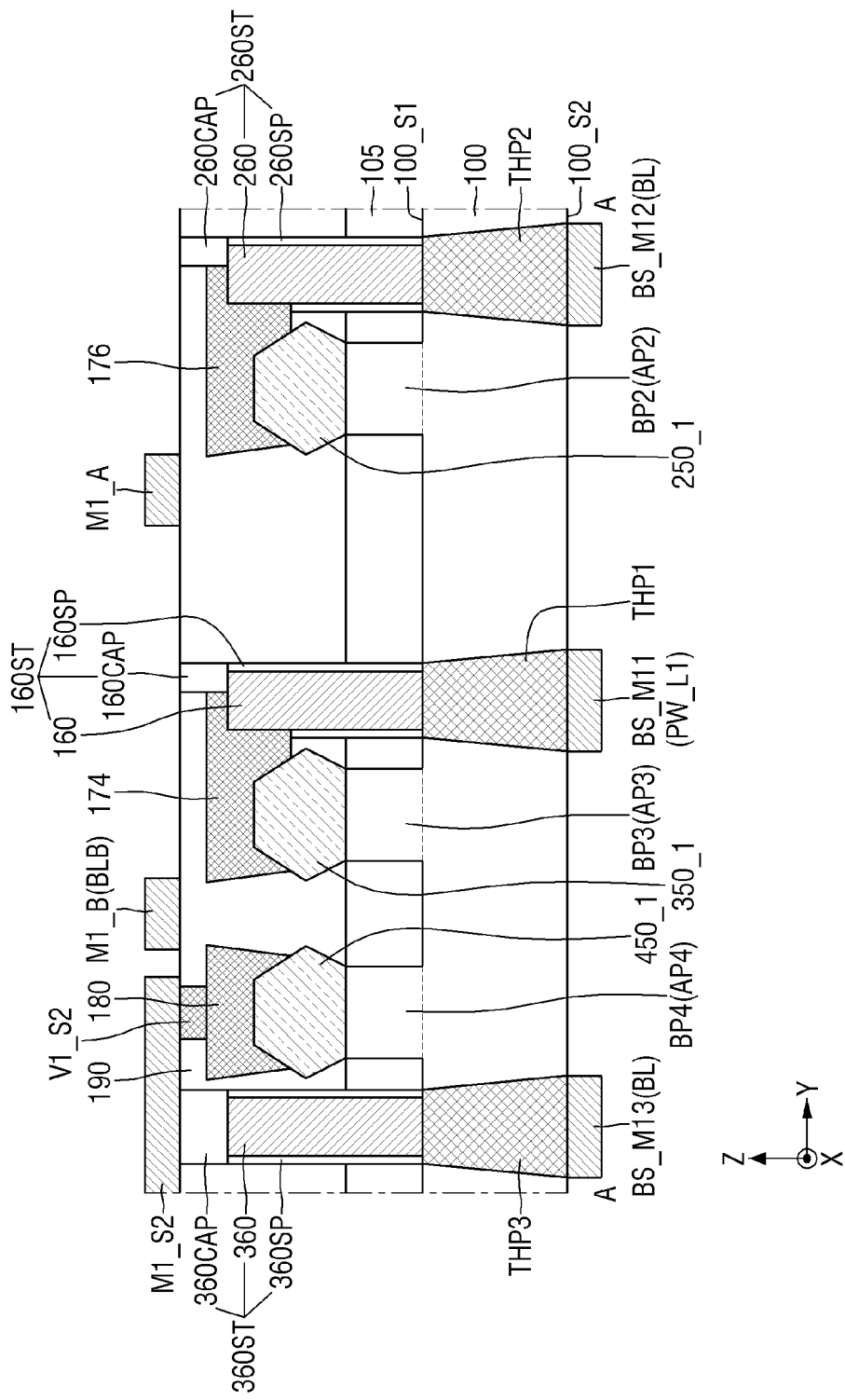
Figure 17:
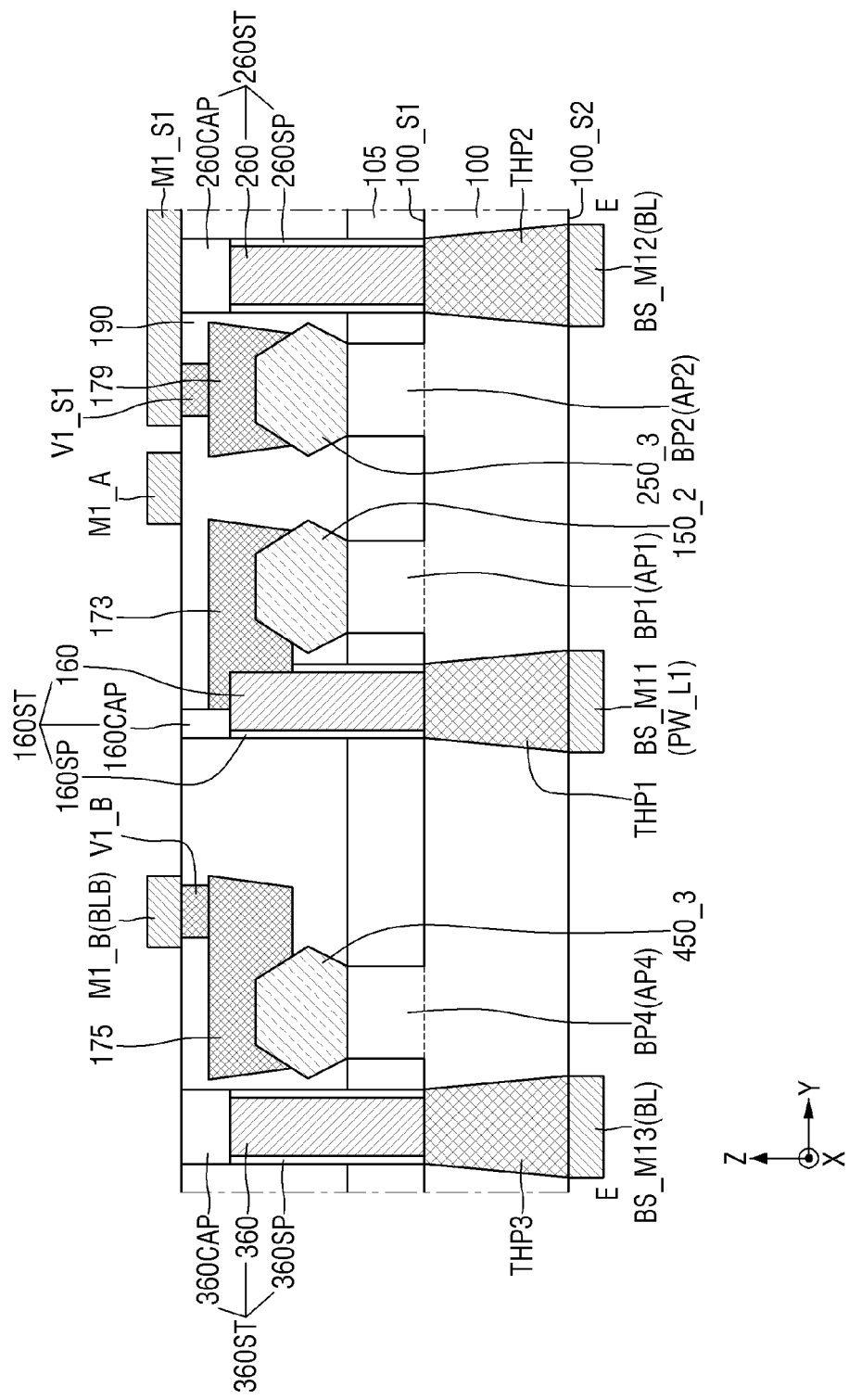

FIG. 15 to FIG. 17 are diagrams for illustrating a semiconductor device according to some embodiments. For convenience of description, following description is based on differences from those as described above with reference to FIG. 1 to FIG. 10.

For reference, FIG. 15 is a layout diagram of the SRAM unit cell of the semiconductor device in FIG. 1 according to some embodiments. FIG. 16 and FIG. 17 are cross-sectional views taken along A-A and E-E of FIG. 15, respectively, according to some embodiments.

Referring to FIG. 15 to FIG. 17, the semiconductor device according to some embodiments may further include a ninth source/drain contact 179, a tenth source/drain contact 180, a third wiring line M1_S1, and a fourth wiring line M1_S2.

The ninth source/drain contact 179 may be disposed on the fifth source/drain pattern 250_3. The ninth source/drain contact 179 is connected to the fifth source/drain pattern 250_3, but is not connected to the second isolated conductive line 260. The ninth source/drain contact 179 is connected to the source/drain area of the first pulldown transistor PD1.

The tenth source/drain contact 180 may be disposed on the eighth source/drain pattern 450_1. The tenth source/drain contact 180 is connected to the eighth source/drain pattern 450_1, but is not connected to the third isolated conductive line 360. The tenth source/drain contact 180 is connected to the source/drain area of the second pulldown transistor PD2.

The first wiring line M1_A may not be connected to the inverters INV1 and INV2 and the pass transistors PS1 and PS2 included in the SRAM unit cell 14 shown in FIG. 3. Although not shown, the first wiring line M1_A may be connected to a transistor included in a SRAM unit cell adjacent to the SRAM unit cell 14 shown in FIG. 3.

The third wiring line M1_S1 and the fourth wiring line M1_S2 are disposed on the first surface 100_S1 of the substrate 200. The third wiring line M1_S1 and the fourth wiring line M1_S2 may be disposed on the interlayer insulating film 190.

For example, the third wiring line M1_S1 may be a second power line, and the fourth wiring line M1_S2 may be a third power line. For example, each of the third wiring line M1_S1 and the fourth wiring line M1_S2 may be the low power line PW_L2 as described above with reference to FIG. 1 to FIG. 10. For example, each of the third wiring line M1_S1 and the fourth wiring line M1_S2 may be the ground node (Vss of FIG. 1).

The first pulldown transistor PD1 may be connected to the third wiring line M1_S1. The fifth source/drain pattern 250_3 of the first pulldown transistor PD1 may be connected to the third wiring line M1_S1 by a third wiring via V1_S1.

The second pulldown transistor PD2 may be connected to the fourth wiring line M1_S2. The eighth source/drain pattern 450_1 of the second pulldown transistor PD2 may be connected to the fourth wiring line M1_S2 by a fourth wiring via V1_S2.

For example, the second rear wiring line BS_M12 may be the first bit-line. The second rear wiring line BS_M12 may be included in the bit-line (BL of FIG. 1). Although not shown, the third rear wiring line BS_M13 may be a bit-line of an SRAM unit cell adjacent to the SRAM unit cell 14 as illustrated in FIG. 3.

The second rear wiring line BS_M12 may be connected to the sixth source/drain contact 176 via the second isolated conductive line 260 and the second through pattern TPH2. The first pass transistor PS1 may be connected to the second rear wiring line BS_M12 disposed on the second surface 100_S2 of the substrate 100. The source/drain area of the first pass transistor PS1 may be connected to the first bit-line disposed on the second surface 100_S2 of the substrate 100.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a substrate including a first surface and a second surface opposite to the first surface;

a first conductive line structure and a second conductive line structure disposed on the first surface of the substrate, extending in a first direction, and spaced apart from each other in a second direction;
a third conductive line structure disposed on the first surface of the substrate and between the first conductive line structure and the second conductive line structure, and extending in the first direction; and
a SRAM unit cell disposed on the first surface of the substrate,
wherein the SRAM unit cell includes:
  a first inverter and a second inverter connected to each other in a cross-coupled manner;
  a first pass transistor connected to the first inverter;
  a second pass transistor connected to the second inverter;
  a first gate electrode included in the first inverter; and
  a second gate electrode included in the first pass transistor,
  wherein the first inverter and the first pass transistor are disposed between the first conductive line structure and the third conductive line structure,
  wherein the second inverter and the second pass transistor are disposed between the second conductive line structure and the third conductive line structure, and
  wherein the first gate electrode and the second gate electrode are disposed between the first conductive line structure and the third conductive line structure.

2. The semiconductor device of claim 1, further comprising:
a first power line disposed on the second surface of the substrate and connected to the third conductive line structure,
wherein each of the first inverter and the second inverter includes a pullup transistor and a pulldown transistor, and
wherein the pullup transistors connect to the third conductive line structure.

3. The semiconductor device of claim 2, further comprising:
a second power line disposed on the second surface of the substrate and connected to the first conductive line structure; and
a third power line disposed on the second surface of the substrate and connected to the second conductive line structure,
wherein the pulldown transistor of the first inverter is connected to the second power line, and
wherein the pulldown transistor of the second inverter is connected to the third power line.

4. The semiconductor device of claim 3, further comprising:
a first bit-line and a second bit-line disposed on the first surface of the substrate,
wherein the first pass transistor is connected to the first bit-line, and
wherein the second pass transistor is connected to the second bit-line.

5. The semiconductor device of claim 2, further comprising:
a first bit-line disposed on the second surface of the substrate and connected to the first conductive line structure; and
a second bit-line disposed on the first surface of the substrate,
wherein the first pass transistor is connected to the first bit-line, and
wherein the second pass transistor is connected to the second bit-line.

6. The semiconductor device of claim 5, further comprising:
a second power line and a third power line disposed on the first surface of the substrate,
wherein the pulldown transistor of the first inverter is connected to the second power line,
wherein the pulldown transistor of the second inverter is connected to the third power line.

7. The semiconductor device of claim 2, further comprising:
a first source/drain contact connected to a source/drain pattern of the pullup transistor of the first inverter; and
a second source/drain contact connected to a source/drain pattern of the pullup transistor of the second inverter,
wherein the third conductive line structure includes an isolated conductive line extending in the first direction, and
wherein each of the first source/drain contact and the second source/drain contact contacts the isolated conductive line.

8. The semiconductor device of claim 1, wherein the SRAM unit cell further includes:
a third gate electrode included in the second inverter, and
a fourth gate electrode included in the second pass transistor,
wherein the third gate electrode and the fourth gate electrode are disposed between the second conductive line structure and the third conductive line structure,
wherein the first gate electrode and the fourth gate electrode aligned with each other in the second direction are isolated from each other via the third conductive line structure, and
wherein the second gate electrode and the third gate electrode aligned with each other in the second direction are isolated from each other via the third conductive line structure.

9. The semiconductor device of claim 8, wherein the first inverter includes a first pullup transistor,
wherein the second inverter includes a second pullup transistor,
wherein a source/drain pattern of the first pullup transistor is connected to the third gate electrode via a connection structure,
wherein the connection structure includes a bridge contact, and a bridge wiring line on the bridge contact, and
wherein the bridge wiring line is disposed on the third conductive line structure and extends in the second direction.

10. The semiconductor device of claim 9, wherein a portion of the bridge contact overlaps the second gate electrode in a third direction perpendicular to the first and second directions, and
wherein the bridge contact is spaced apart from the second gate electrode in the third direction.

11. The semiconductor device of claim 1, further comprising:
a first active pattern and a second active pattern disposed between the first conductive line structure and the third conductive line structure and extending in the first direction,
wherein each of the first active pattern and the second active pattern includes a fin-like pattern which extends in the first direction and protrudes from the first surface of the substrate in a third direction, and wherein the first gate electrode intersects each of the first active pattern and the second active pattern.

12. The semiconductor device of claim 11, wherein each of the first active pattern and the second active pattern includes a sheet pattern disposed on the fin-like pattern and spaced apart from the fin-like pattern in the third direction, and wherein the first gate electrode surrounds the sheet pattern of the first active pattern and the sheet pattern of the second active pattern.

13. The semiconductor device of claim 11, further comprising:

an active pattern separation structure separating the first active pattern and the second active pattern from each other, and extending in the first direction, wherein each of the first active pattern and the second active pattern includes a sheet pattern disposed on the fin-like pattern and spaced apart from the fin-like pattern in the third direction, and wherein each of the sheet pattern of the first active pattern and the sheet pattern of the second active pattern contacts a sidewall of the active pattern separation structure.

14. A semiconductor device comprising:

a substrate including a first surface and a second surface opposite to the first surface;

an SRAM unit cell disposed on the first surface of the substrate;

a first conductive line structure disposed on the first surface of the substrate and extending in a first direction; and a first power line disposed on the second surface of the substrate and connected to the first conductive line structure, wherein the SRAM unit cell includes:
  a first inverter and a second inverter connected to each other in a cross-coupled manner;
  a first pass transistor connected to the first inverter; and
  a second pass transistor connected to the second inverter, wherein the first inverter includes a first pulldown transistor, and a first pullup transistor including a first gate electrode and connected to the first power line, wherein the second inverter includes a second pulldown transistor, and a second pullup transistor including a second gate electrode and connected to the first power line, and wherein each of a short side of the first gate electrode extending in the first direction and a short side of the second gate electrode extending in the first direction faces a sidewall of the first conductive line structure.

15. The semiconductor device of claim 14, further comprising:

a second conductive line structure and a third conductive line structure disposed on the first surface of the substrate, extending in the first direction, and spaced apart from each other in a second direction;

a second power line disposed on the second surface of the substrate and connected to the second conductive line structure; and a third power line disposed on the second surface of the substrate and connected to the third conductive line structure, wherein the first conductive line structure is disposed between the second conductive line structure and the third conductive line structure, wherein the first pulldown transistor is connected to the second power line, and wherein the second pulldown transistor is connected to the third power line.

16. The semiconductor device of claim 15, wherein further comprising:

a first bit-line and a second bit-line disposed on the first surface of the substrate, wherein the first pass transistor is connected to the first bit-line, and wherein the second pass transistor is connected to the second bit-line.

17. The semiconductor device of claim 14, further comprising:

a second conductive line structure and a third conductive line structure disposed on the first surface of the substrate, extending in the first direction, and spaced apart from each other in a second direction;

a first bit-line disposed on the second surface of the substrate and connected to the second conductive line structure; and a second bit-line disposed on the first surface of the substrate, wherein the first conductive line structure is disposed between the second conductive line structure and the third conductive line structure, wherein the first pass transistor is connected to the first bit-line, and wherein the second pass transistor is connected to the second bit-line.

18. The semiconductor device of claim 17, further comprising:

a second power line and a third power line disposed on the first surface of the substrate, wherein the first pulldown transistor is connected to the second power line, and wherein the second pulldown transistor is connected to the third power line.

19. The semiconductor device of claim 14, further comprising:

a connection structure connecting a source/drain area of the first pullup transistor to the second gate electrode, wherein the connection structure includes a bridge contact, and a bridge wiring line on the bridge contact, and wherein the bridge wiring line is disposed on an upper surface of the first conductive line structure, and extends in a second direction.

20. A semiconductor device comprising:

a substrate including a first surface and a second surface opposite to the first surface;

an SRAM unit cell disposed on the first surface of the substrate;

a conductive line structure disposed on the first surface of the substrate, and including an isolated conductive line extending in a first direction and an isolation line insulating film on a sidewall of the isolated conductive line;

a bridge wiring line disposed on the first surface of the substrate, extending in a second direction, and intersecting the isolated conductive line on an upper surface of the isolated conductive line; and a power line disposed on the second surface of the substrate and connected to the isolated conductive line, wherein the SRAM unit cell includes:

a first inverter and a second inverter connected to each other in a cross-coupled manner;
a first pass transistor connected to the first inverter;
a second pass transistor connected to the second inverter;
a first gate electrode included in the first inverter;
a second gate electrode included in the first pass transistor;
a third gate electrode included in the second inverter; and
a fourth gate electrode included in the second pass transistor,
wherein the first gate electrode and the second gate electrode are separated from the third gate electrode and the fourth gate electrode by the conductive line structure,
wherein a pullup transistor of the first inverter and a pullup transistor of the second inverter are connected to the power line, and
wherein the bridge wiring line connects a source/drain area of the pullup transistor of the first inverter to the third gate electrode.

* * * * *